US011942457B2

(12) United States Patent
Chang

(10) Patent No.: US 11,942,457 B2
(45) Date of Patent: *Mar. 26, 2024

(54) DISPLAY DEVICE USING SEMICONDUCTOR LIGHT EMITTING ELEMENT

(71) Applicant: LG ELECTRONICS INC., Seoul (KR)

(72) Inventor: Younghak Chang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/713,927

(22) Filed: Apr. 5, 2022

(65) Prior Publication Data

US 2022/0231000 A1 Jul. 21, 2022

Related U.S. Application Data

(63) Continuation of application No. 16/627,566, filed as application No. PCT/KR2017/007084 on Jul. 4, 2017, now Pat. No. 11,322,488.

(30) Foreign Application Priority Data

Jun. 30, 2017 (KR) .......................... 10-2017-0083703

(51) Int. Cl.
*H01L 33/00* (2010.01)
*H01L 25/075* (2006.01)
(Continued)

(52) U.S. Cl.
CPC ...... *H01L 25/0756* (2013.01); *H01L 25/0753* (2013.01); *H01L 27/156* (2013.01); *H01L 33/0093* (2020.05); *H01L 33/38* (2013.01); *H01L 33/46* (2013.01); *H01L 33/62* (2013.01); *H01L 33/505* (2013.01)

(58) Field of Classification Search
None
See application file for complete search history.

(56) References Cited

U.S. PATENT DOCUMENTS 5,696,389 A 12/1997 Ishikawa et al.
6,100,103 A 8/2000 Shim et al.
(Continued)

FOREIGN PATENT DOCUMENTS

CN 106062858 A 10/2016
CN 106663721 A 5/2017
(Continued)

*Primary Examiner* — Bradley Smith
(74) *Attorney, Agent, or Firm* — Birch, Stewart, Kolasch & Birch, LLP

(57) ABSTRACT

Discussed is a display device including a light emitting element module on a substrate, wherein the light emitting element module includes a plurality of semiconductor light emitting elements disposed on the substrate, a plurality of individual electrode portions electrically connected to each of the plurality of semiconductor light emitting elements and a common electrode portion electrically connected to each of the plurality of semiconductor light emitting elements, and wherein each of the individual electrode portions is disposed on different sides of the light emitting element module.

19 Claims, 16 Drawing Sheets

(51) Int. Cl.
  *H01L 27/15* (2006.01)
  *H01L 33/38* (2010.01)
  *H01L 33/46* (2010.01)
  *H01L 33/62* (2010.01)
  *H01L 33/50* (2010.01)

(56) References Cited

U.S. PATENT DOCUMENTS

| | | |
|---|---|---|
| 8,269,229 B2 | 9/2012 | Suzuki et al. |
| 11,322,488 B2 * | 5/2022 | Chang ................. H01L 33/38 |
| 2007/0085091 A1 | 4/2007 | Lee |
| 2008/0137333 A1 | 6/2008 | Tamaoki et al. |
| 2010/0051975 A1 | 3/2010 | Suzuki et al. |
| 2010/0084668 A1 | 4/2010 | Choi et al. |
| 2014/0339578 A1 | 11/2014 | Jinbo et al. |
| 2015/0255439 A1 | 9/2015 | Kim |
| 2016/0005789 A1 | 1/2016 | Rhee |
| 2021/0384182 A1 * | 12/2021 | Xu .................... H01L 25/167 |

FOREIGN PATENT DOCUMENTS

| | | |
|---|---|---|
| JP | 7-254732 A | 10/1995 |
| JP | 2002-111059 A | 4/2002 |
| JP | 2006-332688 A | 12/2006 |
| JP | 2010-62351 A | 3/2010 |
| KR | 1999-0085730 A | 12/1999 |
| KR | 10-2005-0054307 A | 6/2005 |
| KR | 10-2010-0016901 A | 2/2010 |
| KR | 10-2010-0078721 A | 7/2010 |
| KR | 10-2012-0052745 A | 5/2012 |

* cited by examiner

DISPLAY DEVICE USING SEMICONDUCTOR LIGHT EMITTING ELEMENT

CROSS-REFERENCE TO RELATED APPLICATIONS

This Application is a Continuation of U.S. patent application Ser. No. 16/627,566, filed on Dec. 30, 2019 (now U.S. Pat. No. 11,322,488, issued on May 3, 2022), which was filed as the National Phase of PCT International Application No. PCT/KR2017/007084, filed on Jul. 4, 2017, which claims the benefit of earlier filing date and right of priority to Korean Application No. 10-2017-0083703, filed on Jun. 30, 2017, the entire contents of all these applications are hereby expressly incorporated by reference into the present application.

BACKGROUND OF THE INVENTION

Field of the Invention

The present invention relates to a display device, and more particularly to a display device using a semiconductor light emitting element.

Discussion of the Related Art

In recent years, display devices having excellent characteristics such as a thin shape, flexibility, and the like, are being developed in a field of a display technology. On the contrary, currently commercialized main displays are represented by liquid crystal displays (LCDs) and active matrix organic light emitting diodes (AMOLEDs).

However, there exist problems such as not-so-fast response time and difficult implementation of flexibility in case of LCDs, and there exist drawbacks such as short life span, and not-so-good yield in case of AMOLEDs.

On the other hand, light emitting diodes (LEDs) are well known light emitting devices for converting an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light emitting elements may be used to implement a display, thereby presenting a scheme for solving the problems.

As such, the display device using the semiconductor light emitting element can implement a fine pitch display device. However, in case of the fine pitch display of more than 400 ppi, it is technically difficult to implement RGB color by disposing a red semiconductor light emitting element, a green semiconductor light emitting element, and a blue semiconductor light emitting element. This is because the pitch value between each sub-cell has to be extremely small. Therefore, an object of the present invention is to provide a configuration to laminate the red semiconductor light emitting element, the green semiconductor light emitting element, and the blue semiconductor light emitting element, in an effort to overcome the foregoing problems.

To achieve these and other advantages and in accordance with the purpose of the present disclosure, as embodied and broadly described herein, there is provided a display device that implements the fine pitch using a semiconductor light emitting element.

One aspect of the present disclosure is to provide a display device that selectively outputs red, green and blue lights in the configuration in which red, green and blue semiconductor light emitting elements are laminated.

SUMMARY OF THE INVENTION

According to one aspect of the present disclosure, there is provided a display device using a semiconductor light emitting element, in which a light emitting element is implemented, that selectively outputs red light, green light and blue light at a narrow area by laminating a red semiconductor light emitting element, a green semiconductor light emitting element and a blue semiconductor light emitting element are laminated such that a light source having a shorter wavelength is disposed at a lower part. In this instance, a distributed Bragg reflector may also be laminated with the semiconductor light emitting element.

Specifically, the display device in accordance with the present disclosure includes a light emitting element module, and the light emitting element module includes a red semiconductor light emitting element that emits a red light, a green semiconductor light emitting element disposed on the top of the red semiconductor light emitting element, and a blue semiconductor light emitting element disposed on the top of the green semiconductor light emitting element, an individual electrode portion that supplies individual signals to the red semiconductor light emitting element, the green semiconductor light emitting element and the blue semiconductor light emitting element, respectively, and a common electrode portion that supplies common signals to the red semiconductor light emitting element, the green semiconductor light emitting element and the blue semiconductor light emitting element.

In one embodiment, between the red semiconductor light emitting element and the green semiconductor light emitting element, a first distributed Bragg reflector (DBR) that penetrates red and reflects green may be disposed.

A second distributed Bragg reflector that penetrates green and red, and reflects blue may be disposed between the green semiconductor light emitting element and the blue semiconductor light emitting element. Below the red semiconductor light emitting element, a third distributed Bragg reflector that reflects red, or a metal mirror may be disposed.

In one embodiment, a first light transmittance adhesive layer may be disposed to cover the red semiconductor light emitting element, and the green semiconductor light emitting element may be attached to the first light transmittance adhesive layer.

The individual electrode portion may include a red electrode portion electrically connected to the red semiconductor light emitting element, and the red electrode portion may be covered by the first light transmittance adhesive layer. A second light transmittance adhesive layer may be disposed to cover the green semiconductor light emitting element, and the red semiconductor light emitting element may be attached to the second light transmittance adhesive layer. The second light transmittance adhesive layer may be extended toward the red semiconductor light emitting element to cover the first light transmittance adhesive layer.

In one embodiment, the individual electrode portion may include a green electrode portion electrically connected to the green semiconductor device, and the green electrode portion may be extended toward the one surface of the first light transmittance adhesive layer. The green electrode portion may be covered by the second light transmittance adhesive layer.

In one embodiment, the individual electrode portion may include a red electrode portion, a green electrode portion and a blue electrode portion each electrically connected to the red semiconductor light emitting element, the green semiconductor light emitting element and the blue semiconductor light emitting element, and the red electrode portion, the green electrode portion and the blue electrode portion may be disposed on different sides of the light emitting element module. The common electrode portion may be disposed on the sides where the red electrode portion, the green electrode portion and the blue electrode portion are not disposed.

In one embodiment, the area may be reduced in order of the red semiconductor light emitting element, the green semiconductor light emitting element and the blue semiconductor light emitting element. The light emitting element module may be one of the light emitting element modules arranged sequentially along the columns and rows on the substrate.

In the display device according to an aspect of the present disclosure, the red semiconductor light emitting element, green semiconductor light emitting element and blue semiconductor light emitting element are laminated so that the light source with short wavelength is located below, so the laminated RGB light emitting element module is proposed. In addition, it is possible to solve the problems such as the limitations of the size of sub-cells and the limitations of inter-cell pitch, thereby enabling a fine pitch display device.

In addition, a distributed Bragg reflector is disposed between the semiconductor light emitting elements of different colors, thereby eliminating the color mixture problem. In other words, green light excites a red semiconductor light emitting element, but the distributed Bragg reflector that reflects green is disposed at the bottom to reflect the light directed to the red semiconductor light emitting element to the upper part. On the other hand, the red light of the red semiconductor light emitting element can be emitted to the upper part by penetrating the distributed Bragg reflector.

DETAILED DESCRIPTION OF THE EMBODIMENTS

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present invention is not limited by the accompanying drawings.

It will be understood that when an element such as a layer, area or substrate is referred to as being "on" another element, it can be directly on the element, or one or more intervening elements may also be present.

A display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it will be readily apparent to those skilled in the art that the configuration according to the embodiments described herein may also be applied to a new product type that will be developed later if the device is a device capable of emitting light.

Figure 1:
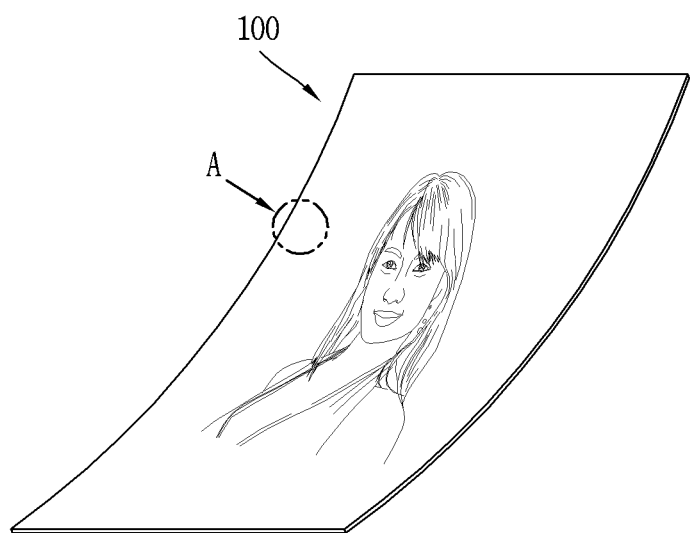
FIG. 1 is a conceptual view illustrating one embodiment of a display device using a semiconductor light emitting diode according to the present invention.

FIG. 1 is a conceptual view illustrating one embodiment of a display device using a semiconductor light emitting diode according to the present invention.

According to the drawing, information processed in the controller of the display device 100 may be displayed using a flexible display.

The flexible display may include a flexible, bendable, twistable, foldable and rollable display. For example, the flexible display may be a display fabricated on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated in the drawing, information displayed in the second state may be visual information output on a curved surface. Such visual information is realized by independently controlling an emission of unit pixels (sub-pixels) arranged in a matrix form. The unit pixel denotes an elementary unit for representing one color.

The sub-pixel of the flexible display may be implemented by a semiconductor light emitting element. The present invention exemplarily illustrates a light emitting diode (LED) as a type of semiconductor light emitting element for converting current into light. The light emitting diode may be formed with a small size to perform the role of a sub-pixel even in the second configuration through this.

Hereinafter, a flexible display implemented using the light emitting diode will be described in more detail with reference to the accompanying drawings.

Figure 2:
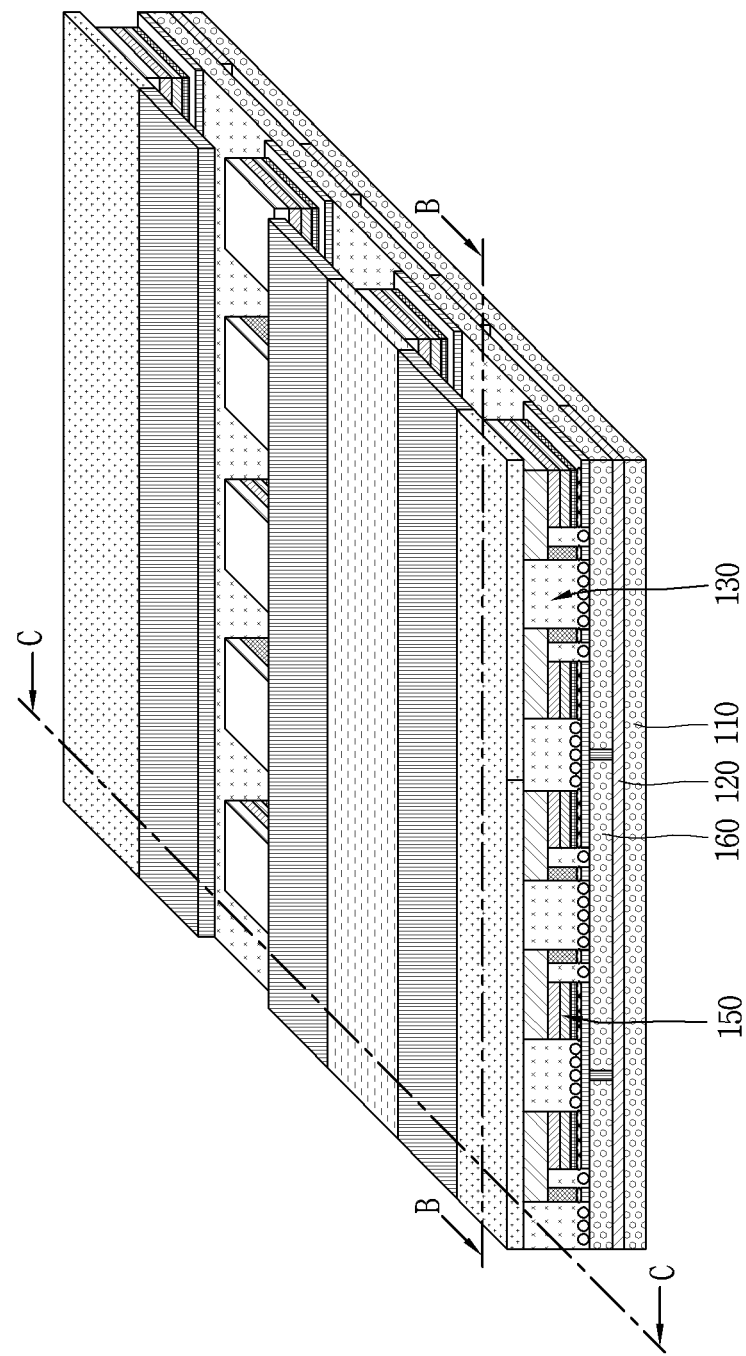
FIG. 2 is a partially enlarged view of part A of FIG. 1, and FIGS. 3A and 3B are sectional views taken along the lines B-B and C-C of FIG. 2.
Figure 3A:
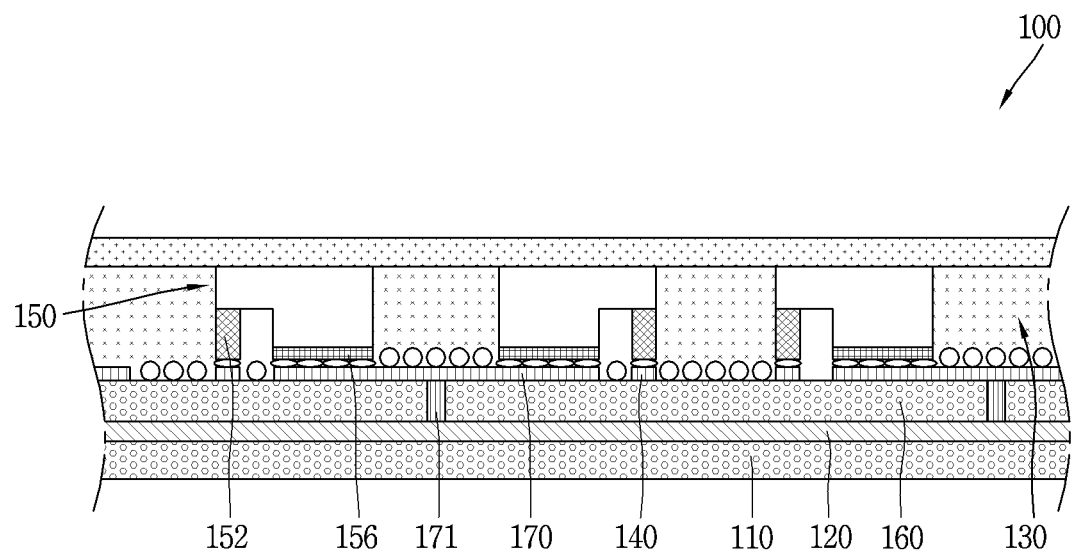
Figure 3B:
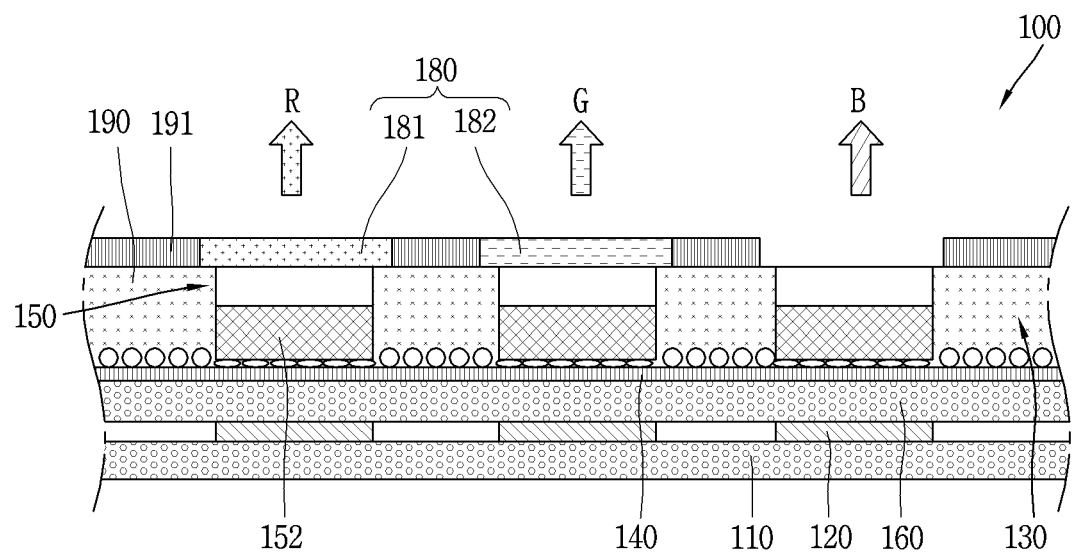
Figure 4:
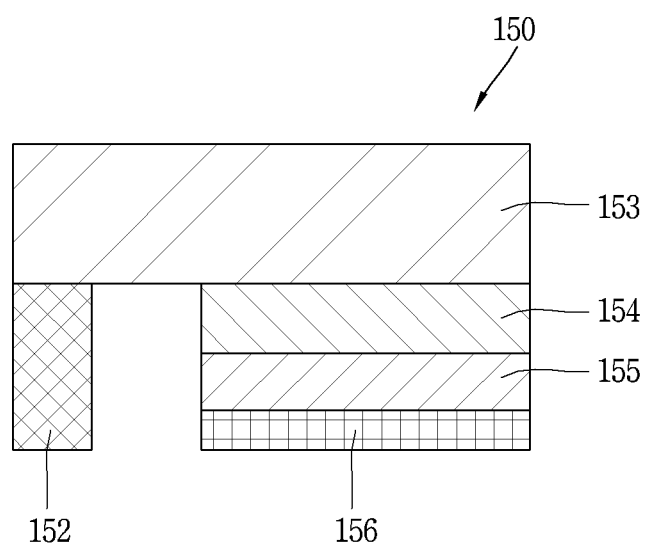
FIG. 4 is a conceptual view illustrating a flip chip type semiconductor light emitting element of FIG. 3.

FIG. 2 is a partial enlarged view of portion "A" in FIG. 1, and FIGS. 3A and 3B are cross-sectional views taken along lines B-B and C-C in FIG. 2, FIG. 4 is a conceptual view illustrating a flip-chip type semiconductor light emitting element in FIG. 3A, and FIGS. 5A through 5C are conceptual views illustrating various forms for implementing colors in connection with a flip-chip type semiconductor light emitting element.

Referring to FIGS. 2, 3A and 3B, there is illustrated a display device 100 using a passive matrix (PM) type semiconductor light emitting element as a display device 100 using a semiconductor light emitting element. However, an example described below may also be applicable to an active matrix (AM) type semiconductor light emitting element.

The display device 100 may include a substrate 110, a first electrode 120, a conductive adhesive layer 130, a second electrode 140, and a plurality of semiconductor light emitting elements 150.

The substrate 110 may be a flexible substrate. The substrate 110 may contain glass or polyimide (PI) to implement the flexible display device. The substrate 110 may alternatively be made of any material with insulating property and flexibility, for example, polyethylene naphthalate (PEN), polyethylene terephthalate (PET), and the like. Furthermore, the substrate 110 may be either one of transparent and non-transparent materials.

The substrate 110 may be a wiring substrate provided with the first electrode 120, and thus the first electrode 120 may be disposed on the substrate 110.

As illustrated, an insulating layer 160 may be disposed on the substrate 110 on which the first electrode 120 is located, and an auxiliary electrode 170 may be disposed on the insulating layer 160. In this case, a configuration in which the insulating layer 160 is deposited on the substrate 110 may be a single wiring substrate. More specifically, the insulating layer 160 may be formed of a flexible insulating material, such as polyimide (PI), PET, or PEN, and may be formed integrally with the substrate 110 to form a single substrate.

The auxiliary electrode 170 is an electrode that electrically connects the first electrode 120 and the semiconductor light emitting element 150, and is disposed on the insulating layer 160 to correspond to a position of the first electrode 120. For example, the auxiliary electrode 170 may have a dot-like shape and may be electrically connected to the first electrode 120 by an electrode hole 171 formed through the insulating layer 160. The electrode hole 171 may be formed by filling a conductive material in a via hole.

Referring to the drawings, the conductive adhesive layer 130 may be formed on one surface of the insulating layer 160, but the present disclosure may not be necessarily limited to this. For example, a layer performing a specific function may be disposed between the insulating layer 160 and the conductive adhesive layer 130, or the conductive adhesive layer 130 may also be disposed on the substrate 110 without the insulating layer 160. The conductive adhesive layer 130 may perform the role of an insulating layer in the structure in which the conductive adhesive layer 130 is disposed on the substrate 110.

The conductive adhesive layer 130 may be a layer having adhesiveness and conductivity, and to this end, a conductive material and an adhesive material may be mixed on the conductive adhesive layer 130. Furthermore, the conductive adhesive layer 130 may have flexibility, thereby allowing a flexible function in the display device.

For such an example, the conductive adhesive layer 130 may be an anisotropic conductive film (ACF), an anisotropic conductive paste, a solution containing conductive particles, and the like. The conductive adhesive layer 130 may allow electrical interconnection in the z-direction passing through the thickness thereof, but may be configured as a layer having electrical insulation in the horizontal x-y direction thereof. Accordingly, the conductive adhesive layer 130 may be referred to as a z-axis conductive layer (however, hereinafter referred to as a "conductive adhesive layer").

The anisotropic conductive film is a film in which an anisotropic conductive medium is mixed with an insulating base member. When heat and pressure are applied, only a specific portion has conductivity by the anisotropic conductive medium. Hereinafter, description will be given of an example that heat and pressure are applied to the anisotropic conductive film, but other methods may alternatively be used to allow the anisotropic conductive film to partially have conductivity. Examples of this method may be a method of applying one of the heat and the pressure, a UV curing method, and the like.

In addition, the anisotropic conductive medium may be, for example, a conductive ball or a conductive particle. According to this embodiment, the anisotropic conductive film is a film in which conductive balls are mixed with an insulating base member. When heat and pressure are applied, only specific portion of the anisotropic conductive film obtains conductivity by the conductive balls. The anisotropic conductive film may be a state of containing a plurality of particles each of which a core of a conductive material is coated with an insulating film made of a polymer material. In this case, the insulating film of a portion to which heat and pressure have been applied is broken and thus obtains the conductivity by the core. At this time, the shape of the core may be deformed to form a layer brought into contact with each other in a thickness direction of the film. As a more specific example, heat and pressure are applied to the entire anisotropic conductive film, and an electric connection in the Z-axis direction is partially formed by a height difference of an object adhered by the anisotropic conductive film.

As another example, the anisotropic conductive film may be a state of containing a plurality of particles each of which the insulating core is coated with the conductive material. In this case, the conductive material in the portion, to which the heat and pressure have been applied, is deformed (stuck, pressed) and thus the portion has the conductivity in the thickness direction of the film. As another example, the conductive material may penetrate through the insulating base member in the Z-axial direction such that the film has the conductivity in its thickness direction. In this case, the conductive material may have a sharp end portion.

The anisotropic conductive film may be a fixed array anisotropic conductive film (ACF) in which conductive balls are inserted into one surface of the insulating base member. More specifically, the insulating base member is formed of a material having adhesiveness, and the conductive balls are concentrated on a bottom portion of the insulating base member. When heat and pressure are applied to the base member, the base member is deformed together with the conductive balls so as to obtain conductivity in a perpendicular direction.

However, the present invention is not limited thereto. The anisotropic conductive film may alternatively be formed by randomly inserting conductive balls into the insulating base member, or may be configured in a form of double-ACF in which a plurality of layers are provided and the conductive balls are disposed in one of the layers.

The anisotropic conductive paste is a combination of a paste and conductive balls, namely, may be a paste in which conductive balls are mixed with a base material having insulating property and adhesiveness. In addition, the solution containing conductive particles may be a solution in which conductive particles or nano particles are contained.

Referring again to the drawing, the second electrode 140 is located at the insulating layer 160 with being spaced apart from the auxiliary electrode 170. In other words, the conductive adhesive layer 130 is disposed on the insulating layer 160 where the auxiliary electrode 170 and second electrode 140 are located.

When the conductive adhesive layer 130 is formed in a state that the auxiliary electrode 170 and second electrode 140 are located on the insulating layer 160 and then the semiconductor light emitting element 150 is connected thereto in a flip chip form with the application of heat and pressure, the semiconductor light emitting element 150 is electrically connected to the first electrode 120 and second electrode 140.

Referring to FIG. 4, the semiconductor light emitting element may be a flip chip type light emitting element.

For example, the semiconductor light emitting element includes a p-type electrode 156, a p-type semiconductor layer 155 on which the p-type electrode 156 is formed, an active layer 154 disposed on the p-type semiconductor layer 155, an n-type electrode 153 disposed on the active layer 154, and an n-type electrode 152 disposed on the n-type semiconductor layer 153 with being spaced apart from the p-type electrode 156 in a horizontal direction. In this case, the p-type electrode 156 may be electrically connected to the auxiliary electrode 170 and the conductive adhesive layer 130, and the n-type electrode 152 may be electrically connected to the second electrode 140.

Referring back to FIGS. 2 and 3, the auxiliary electrode 170 may be formed long in one direction, and one auxiliary electrode may be electrically connected to the plurality of semiconductor light emitting elements 150. For example, the p-type electrodes of the left and right semiconductor light emitting elements based on the auxiliary electrode may be electrically connected to one auxiliary electrode.

More specifically, the semiconductor light emitting element 150 is press-fitted into the conductive adhesive layer 130 by heat and pressure. Accordingly, only a portion between the p-type electrode 156 and auxiliary electrode 170 of the semiconductor light emitting element 150 and a portion between the n-type electrode 152 and second electrode 140 of the semiconductor light emitting element 150 have conductivity, and the remaining portion does not have conductivity since there is no press-fitting of the semiconductor light emitting element. As described above, the conductive adhesive layer 130 allow the mutual connection as well as an electrical connection between the semiconductor light emitting element 150 and the auxiliary electrode 170 and between the semiconductor light emitting element 150 and the second electrode 140.

In addition, the plurality of semiconductor light emitting elements 150 constitute a light emitting element array, and a phosphor layer 180 is formed on the light emitting element array.

The light emitting element array may include a plurality of semiconductor light emitting elements having different brightness values. Each of the semiconductor light emitting elements 150 constitutes a unit pixel and is electrically connected to the first electrode 120. For example, the first electrode 120 may be in plurality. The semiconductor light emitting elements, for example, may be arranged in several rows, and the semiconductor light emitting elements in each row may be electrically connected to one of the plurality of first electrodes.

In addition, since the semiconductor light emitting elements are connected in a form of a flip chip, the semiconductor light emitting elements grown on a transparent dielectric substrate can be used. The semiconductor light emitting elements may be, for example, nitride semiconductor light emitting elements. Since the semiconductor light emitting element 150 has excellent brightness, it can constitute an individual unit pixel even though it has a small size.

According to the drawing, a partition wall 190 may be formed between the semiconductor light emitting elements 150. In this case, the partition wall 190 may perform the role of dividing individual sub-pixels from one another, and be formed as an integral body with the conductive adhesive layer 130. For example, a base member of the anisotropic conductive film may form the partition wall when the semiconductor light emitting element 150 is inserted into the anisotropic conductive film.

Furthermore, when the base member of the anisotropic conductive film is black, the partition wall 190 may have reflective characteristics and simultaneously increase contrast even without an additional black insulator.

As another example, a reflective partition wall may be separately provided as the partition wall 190. In this case, the partition wall 190 may include a black or white insulator according to the purpose of the display device. Reflectivity can be enhanced when the partition wall of the white insulator is used, and reflective characteristics can be obtained and simultaneously contrast can increase when the partition wall of the black insulator is used.

The phosphor layer 180 may be located at an outer surface of the semiconductor light emitting element 150. For example, the semiconductor light emitting element 150 is a blue semiconductor light emitting element that emits blue (B) light, and the phosphor layer 180 performs the role of converting the blue (B) light into a color of a sub-pixel. The phosphor layer 180 may be a red phosphor layer 181 or green phosphor layer 182 constituting individual pixels.

In other words, a red phosphor 181 capable of converting blue light into red (R) light may be deposited on the blue semiconductor light emitting element 151 at a location implementing a red sub-pixel, and a green phosphor 182 capable of converting blue light into green (G) light may be deposited on the blue semiconductor light emitting element 151 at a location implementing a green sub-pixel. Furthermore, only the blue semiconductor light emitting element 151 may be solely used at a location implementing a blue sub-pixel. In this case, the red (R), green (G) and blue (B) sub-pixels may implement one pixel. More specifically, one color phosphor may be deposited along each line of the first electrode 120. Accordingly, one line on the first electrode 120 may be an electrode controlling one color. In other words, red (R), green (B) and blue (B) may be sequentially disposed along the second electrode 140, thereby implementing sub-pixels.

However, the present invention may not be necessarily limited to this, and the semiconductor light emitting element 150 may be combined with a quantum dot (QD) instead of the phosphor to implement such as red (R), green (G) and blue (B) sub-pixels.

Furthermore, a black matrix 191 may be disposed between each phosphor layer to enhance contrast. In other words, the black matrix 191 can enhance the contrast of luminance.

However, the present invention may not be necessarily limited to this, and another structure for implementing blue, red and green lights may be also applicable thereto.

Figure 5A:
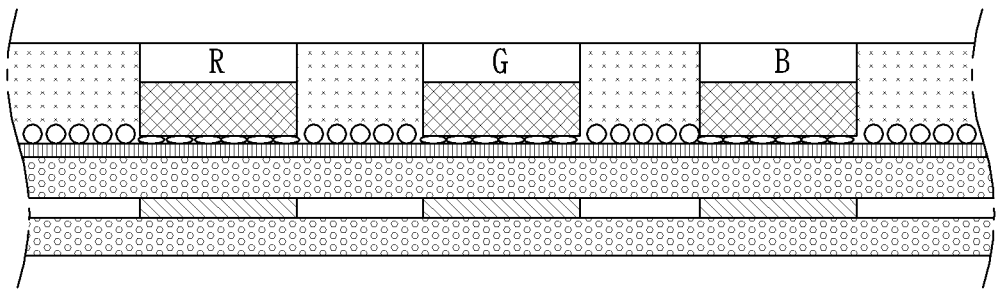
FIGS. 5A to 5C are conceptual views illustrating various forms of realizing a color in relation to a flip chip type semiconductor light emitting element.

Referring to FIG. 5A, each of the semiconductor light emitting elements 150 may be implemented as a high-power light emitting element that emits various light including blue light in a manner that gallium nitride (GaN) is mostly used, and indium (In) and or aluminum (Al) are added thereto.

In this case, the semiconductor light emitting elements 150 may be red, green and blue semiconductor light emitting elements, respectively, to implement each sub-pixel. For instance, red, green and blue semiconductor light emitting elements (R, G, B) are alternately disposed, and red, green and blue sub-pixels implement one pixel by means of the red, green and blue semiconductor light emitting elements, thereby implementing a full color display.

Figure 5B:
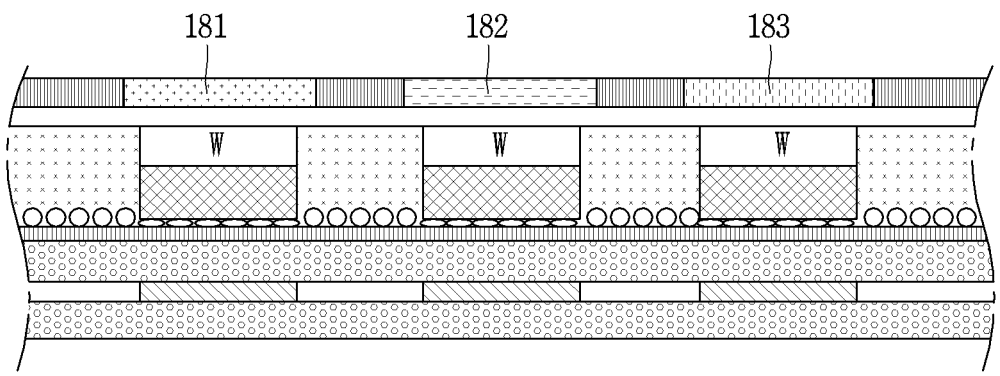

Referring to FIG. 5B, the semiconductor light emitting element may have a white light emitting element (W) provided with a yellow phosphor layer for each element. In this case, a red phosphor layer 181, a green phosphor layer 182 and a blue phosphor layer 183 may be provided on the white light emitting element (W) to implement a sub-pixel. Furthermore, the unit pixel may be formed by using a color filter repeated with red, green and blue on the white light emitting element (W).

Figure 5C:
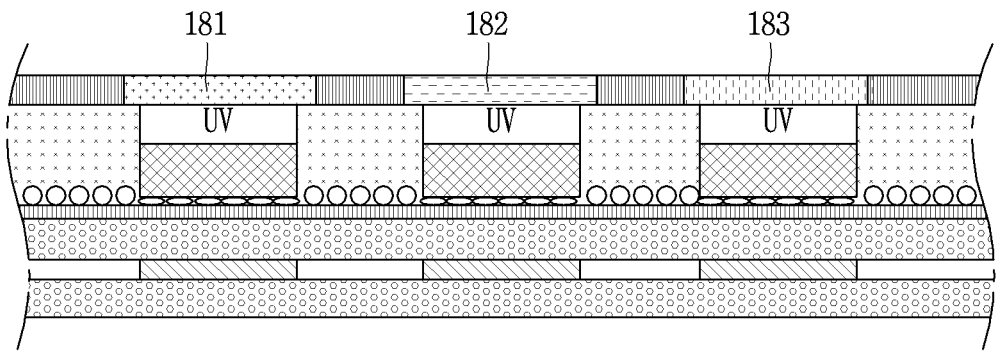

Referring to FIG. 5C, it may also be possible to have a structure in which a red phosphor layer 181, a green phosphor layer 182 and blue phosphor layer 183 are provided on a ultra violet light emitting element (UV). In this manner, the semiconductor light emitting element can be used over the entire region up to ultra violet (UV) as well as visible light, and may be extended to a form of semiconductor light emitting element in which ultra violet (UV) can be used as an excitation source.

Taking this example into consideration again, the semiconductor light emitting element 150 is disposed on the conductive adhesive layer 130 to configure a sub-pixel in the display device. The semiconductor light emitting element 150 has an excellent luminance characteristic, and thus it may be possible to configure individual sub-pixels even with a small size thereof. The size of the individual semiconductor light emitting element 150 may be less than 80 µm in the length of one side thereof, and may be a rectangular or square shaped device. In case of a rectangular shaped device, the size thereof may be less than 20×80 µm.

Furthermore, even when a square shaped semiconductor light emitting element 150 with a length of side of 10 µm is used for a sub-pixel, it will exhibit sufficient brightness for implementing a display device. Accordingly, for example, in case of a rectangular pixel in which one side of a sub-pixel is 600 µm in size, and the remaining one side thereof is 300 µm, a relative distance between the semiconductor light emitting elements becomes sufficiently large. Accordingly, in this case, it may be possible to implement a flexible display device having an HD image quality.

A display device using the foregoing semiconductor light emitting element will be fabricated by a new type of fabrication method. Hereinafter, the fabrication method will be described with reference to FIG. 6.

Figure 6:
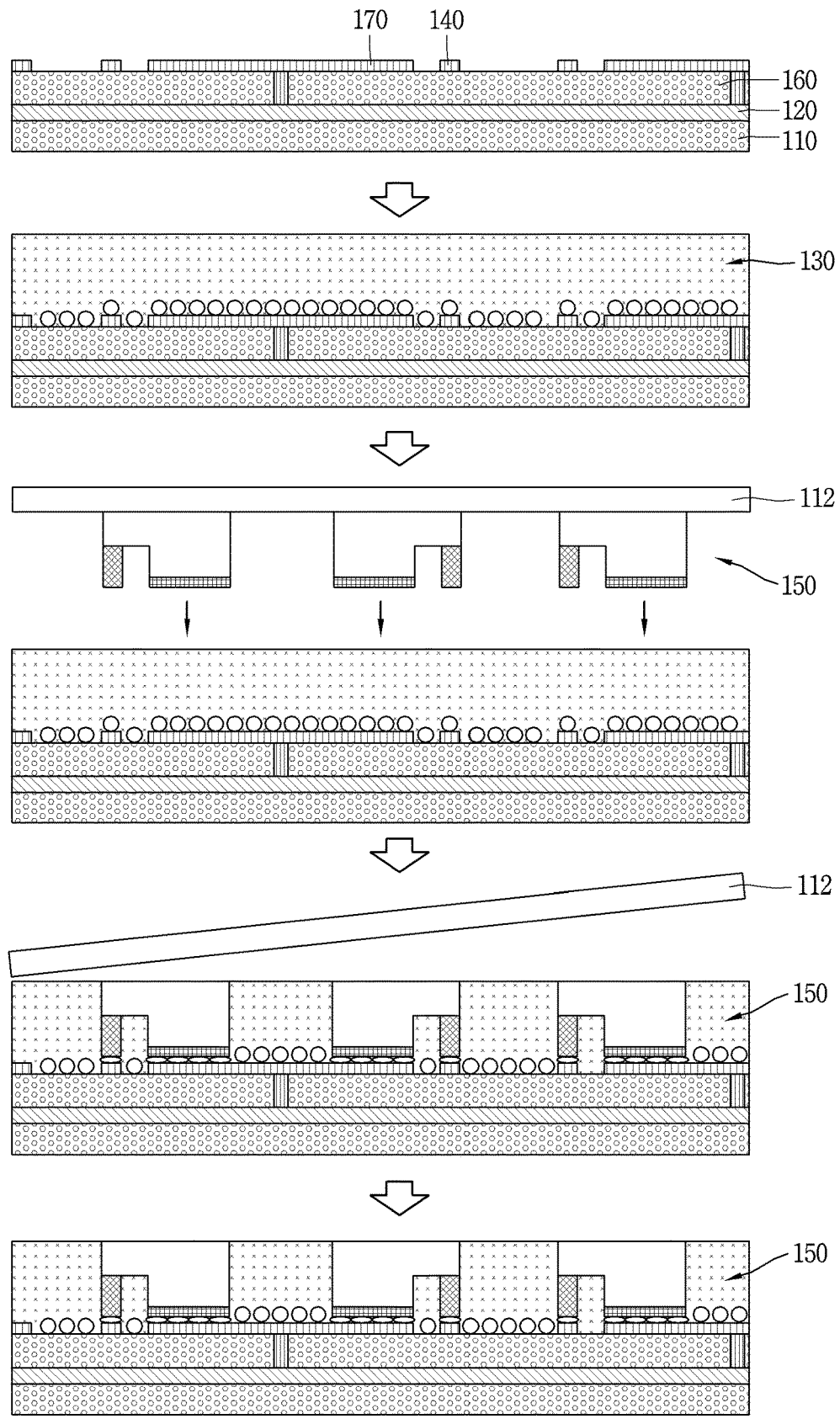
FIG. 6 is a sectional view illustrating a method of manufacturing a display device using a semiconductor light emitting diode according to the present invention.

FIG. 6 is a sectional view illustrating a method of manufacturing a display device using a semiconductor light emitting diode according to the present invention.

Referring to the drawing, first, the conductive adhesive layer 130 is formed on the insulating layer 160 where the auxiliary electrode 170 and second electrode 140 are located. The insulating layer 160 is deposited on the first substrate 110 to form one substrate (or wiring substrate), and the first electrode 120, the auxiliary electrode 170 and the second electrode 140 are disposed at the wiring substrate. In this case, the first electrode 120 and second electrode 140 may be disposed in an orthogonal direction to each other. Furthermore, the first substrate 110 and insulating layer 160 may contain glass or polyimide (PI), respectively, to implement a flexible display device.

The conductive adhesive layer 130 may be implemented by an anisotropic conductive film, for example, and to this end, an anisotropic conductive film may be coated on the substrate where the insulating layer 160 is located.

Next, a second substrate 112 having the plurality of semiconductor light emitting elements 150 which correspond to the locations of the auxiliary electrodes 170 and second electrodes 140 and constitute individual pixels is disposed such that the semiconductor light emitting element 150 faces the auxiliary electrode 170 and the second electrode 140.

In this case, the second substrate 112 as a growth substrate for growing the semiconductor light emitting element 150 may be a sapphire substrate or silicon substrate.

The semiconductor light emitting element may have a gap and size capable of implementing a display device when formed in the unit of wafer, and thus effectively used for a display device.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. Only portions between the semiconductor light emitting element 150 and the auxiliary electrode 170 and second electrode 140 may have conductivity due to the characteristics of an anisotropic conductive film having conductivity by thermal compression, thereby allowing the electrodes and semiconductor light emitting element 150 to be electrically connected to each other. At this time, the semiconductor light emitting element 150 may be inserted into the anisotropic conductive film, thereby forming a partition wall between the semiconductor light emitting elements 150.

Next, the second substrate 112 is removed. For example, the second substrate 112 may be removed using a laser lift-off (LLO) or chemical lift-off (CLO) method.

Finally, the second substrate 112 is removed to expose the semiconductor light emitting elements 150 to the outside. Silicon oxide (SiOx) or the like may be coated on the wiring substrate coupled to the semiconductor light emitting element 150 to form a transparent insulating layer (not shown).

Furthermore, it may further include the process of forming a phosphor layer on one surface of the semiconductor light emitting element 150. For example, the semiconductor light emitting element 150 may be a blue semiconductor light emitting element for emitting blue (B) light, and a red or green phosphor for converting the blue (B) light into the color of the sub-pixel may form a layer on one surface of the blue semiconductor light emitting element.

The fabrication method or structure of a display device using the foregoing semiconductor light emitting element may be modified in various forms. For such an example, the foregoing display device may also employ a vertical semiconductor light emitting element. Hereinafter, the vertical structure will be described with reference to FIGS. 5 and 6.

Furthermore, according to the following modified example or embodiment, the same or similar reference numerals are designated to the same or similar configurations to the foregoing example, and the description thereof will be substituted by the earlier description.

Figure 7:
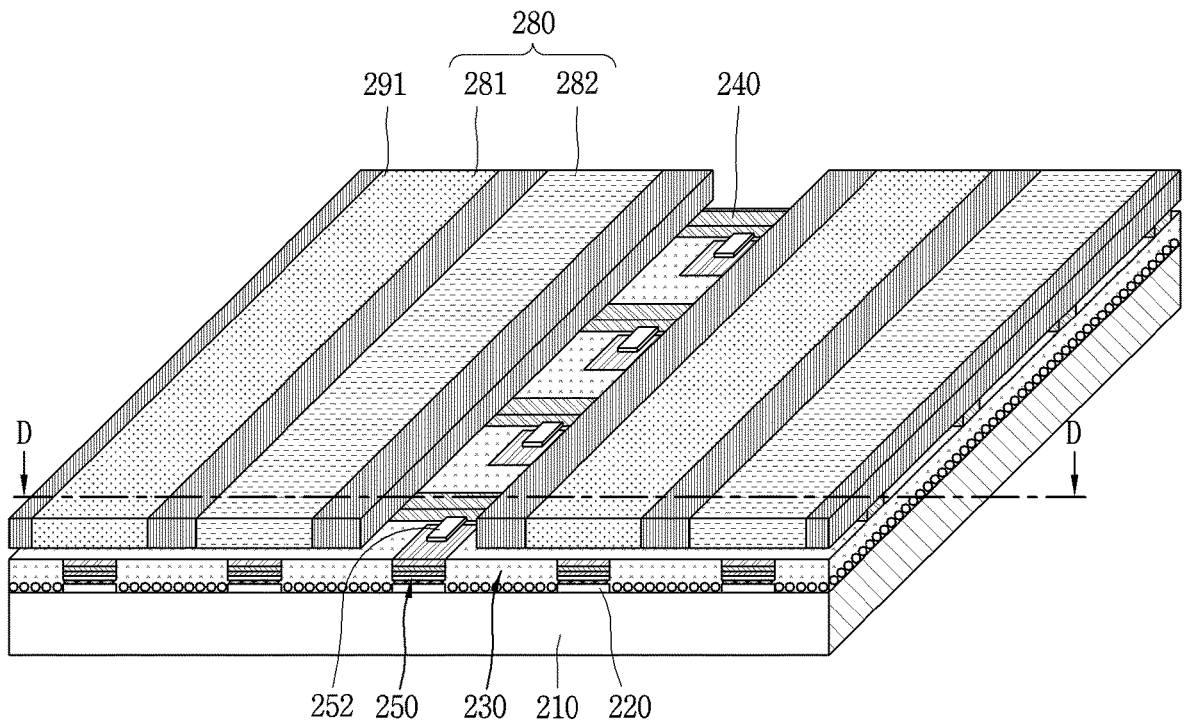
FIG. 7 is a perspective view illustrating another embodiment of a display device using a semiconductor light emitting diode according to the present invention.
Figure 8:
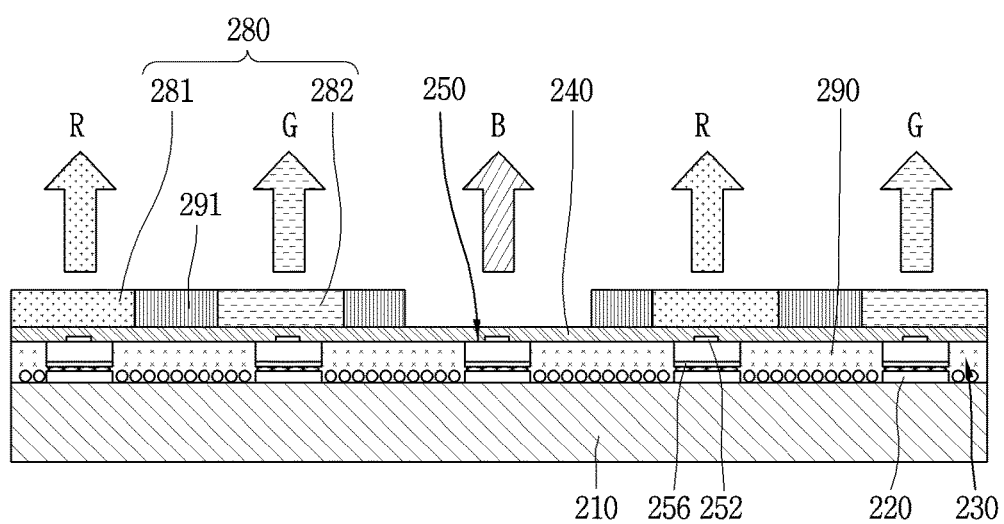
FIG. 8 is a sectional view taken along the line D-D of FIG. 7.
Figure 9:
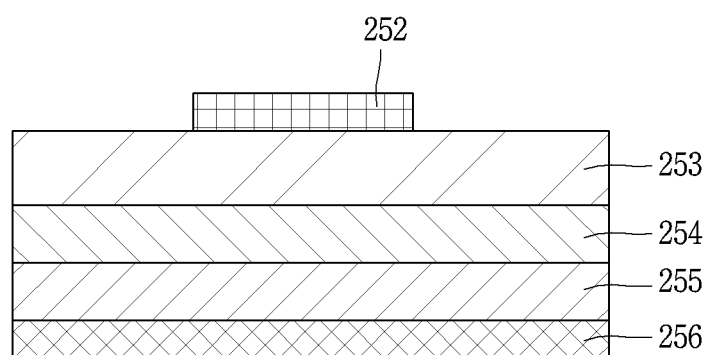
FIG. 9 is a conceptual view illustrating a vertical type semiconductor light emitting element of FIG. 8.

FIG. 7 is a perspective view illustrating a display device using a semiconductor light emitting element according to another embodiment of the present disclosure. FIG. 8 is a cross-sectional view taken along line C-C in FIG. 7, and FIG. 9 is a conceptual view illustrating a vertical type semiconductor light emitting element in FIG. 8.

Referring to these drawings, the display device may be display device using a passive matrix (PM) type of vertical semiconductor light emitting element.

The display device may include a substrate 210, a first electrode 220, a conductive adhesive layer 230, a second electrode 240 and a plurality of semiconductor light emitting elements 250.

The substrate 210 as a wiring substrate disposed with the first electrode 220 may include polyimide (PI) to implement a flexible display device. In addition, any one may be used if it is an insulating and flexible material.

The first electrode 220 may be located on the substrate 210, and may be formed in a shape of a long bar in one direction. The first electrode 220 may be formed to perform the role of a data electrode.

The conductive adhesive layer 230 is formed on the substrate 210 where the first electrode 220 is located. Similarly to a display device to which a flip chip type light emitting element is applied, the conductive adhesive layer 230 may be an anisotropic conductive film (ACF), an anisotropic conductive paste, a solution containing conductive particles, and the like. However, the present embodiment illustrates a case where the conductive adhesive layer 230 is implemented by an anisotropic conductive film.

When an anisotropic conductive film is located in a state that the first electrode 220 is located on the substrate 210, and then heat and pressure are applied to connect the semiconductor light emitting element 250 thereto, the semiconductor light emitting element 250 is electrically connected to the first electrode 220. At this time, the semiconductor light emitting element 250 may be preferably disposed on the first electrode 220.

The electrical connection is generated because an anisotropic conductive film partially has conductivity in the thickness direction when heat and pressure are applied as described above. Accordingly, the anisotropic conductive film is partitioned into a portion 231 having conductivity and a portion 232 having no conductivity in the thickness direction thereof.

Furthermore, the anisotropic conductive film contains an adhesive component, and thus the conductive adhesive layer 230 implements a mechanical coupling as well as an electrical coupling between the semiconductor light emitting element 250 and the first electrode 220.

In this manner, the semiconductor light emitting element 250 is disposed on the conductive adhesive layer 230, thereby configuring a separate sub-pixel in the display device. Since the semiconductor light emitting element 250 has excellent brightness, it can constitute an individual unit pixel even though it has a small size. The size of the individual semiconductor light emitting element 250 may be less than 80 µm in the length of one side thereof, and may be a rectangular or square shaped device. In case of a rectangular shaped device, the size thereof may be less than 20×80 µm.

The semiconductor light emitting element 250 may be a vertical structure.

A plurality of second electrodes 240 disposed in a direction of crossing the length direction of the first electrode 220, and electrically connected to the vertical semiconductor light emitting element 250 may be located between vertical semiconductor light emitting elements.

Referring to FIG. 9, the vertical type semiconductor light emitting element includes a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on the n-type semiconductor layer 253. In this case, the p-type electrode 256 located at the bottom thereof may be electrically connected to the first electrode 220 by the conductive adhesive layer 230, and the n-type electrode 252 located at the top thereof may be electrically connected to the second electrode 240 which will be described later. The electrodes may be disposed in the upward/downward direction in the vertical semiconductor light emitting element 250, thereby providing a great advantage capable of reducing the chip size.

Referring again to FIG. 8, a phosphor layer 280 may be formed on one surface of the semiconductor light emitting element 250. For example, the semiconductor light emitting element 250 is a blue semiconductor light emitting element 251 that emits blue (B) light, and the phosphor layer 280 for converting the blue (B) light into the color of the sub-pixel may be provided thereon. In this case, the phosphor layer 280 may be a red phosphor 281 and a green phosphor 282 constituting individual pixels.

In other words, a red phosphor 281 capable of converting blue light into red (R) light may be deposited on the blue semiconductor light emitting element 251 at a location implementing a red sub-pixel, and a green phosphor 282 capable of converting blue light into green (G) light may be deposited on the blue semiconductor light emitting element 251 at a location implementing a green sub-pixel. Furthermore, only the blue semiconductor light emitting element 251 may be solely used at a location implementing a blue sub-pixel. In this case, the red (R), green (G) and blue (B) sub-pixels may implement one pixel.

However, the present invention may not be necessarily limited to this, and another structure for implementing blue, red and green may be also applicable thereto as described above in a display device to which a flip chip type light emitting element is applied.

Taking this embodiment into consideration again, the second electrode 240 is located between the semiconductor light emitting elements 250, and electrically connected to the semiconductor light emitting elements 250. For example, the semiconductor light emitting elements 250 may be disposed in a plurality of rows, and the second electrode 240 may be disposed between the rows of the semiconductor light emitting elements 250.

Since a distance between the semiconductor light emitting elements 250 constituting individual pixels is sufficiently large, the second electrode 240 may be located between the semiconductor light emitting elements 250.

The second electrode 240 may be formed as a bar-shaped electrode elongated in one direction, and disposed in a perpendicular direction to the first electrode.

Furthermore, the second electrode 240 may be electrically connected to the semiconductor light emitting element 250 by a connecting electrode protruded from the second electrode 240. More specifically, the connecting electrode may be an n-type electrode of the semiconductor light emitting element 250. For example, the n-type electrode is formed as an ohmic electrode for ohmic contact, and the second electrode covers at least part of the ohmic electrode by printing or deposition. Through this, the second electrode 240 may be electrically connected to the n-type electrode of the semiconductor light emitting element 250.

According to the drawing, the second electrode 240 may be located on the conductive adhesive layer 230. According to circumstances, a transparent insulating layer (not shown) containing silicon oxide (SiOx) may be formed on the substrate 210 provided with the semiconductor light emitting element 250. When the transparent insulating layer is formed and then the second electrode 240 is disposed thereon, the second electrode 240 may be located on the transparent insulating layer. Furthermore, the second electrode 240 may be formed to be spaced apart from the conductive adhesive layer 230 or transparent insulating layer.

If a transparent electrode such as indium tin oxide (ITO) is used to locate the second electrode 240 on the semiconductor light emitting element 250, the ITO material has a problem of bad adhesiveness with an n-type semiconductor. Accordingly, the second electrode 240 may be disposed between the semiconductor light emitting elements 250, thereby obtaining an advantage in which the transparent electrode is not required. Therefore, an n-type semiconductor layer and a conductive material having good adhesiveness may be used as a horizontal electrode without being restricted by the selection of a transparent material, thereby enhancing the light extraction efficiency.

According to the drawing, a partition wall 290 may be disposed between the semiconductor light emitting elements 250. In other words, the partition wall 290 may be disposed between the vertical semiconductor light emitting elements 250 to isolate the semiconductor light emitting element 250 constituting individual pixels. In this case, the partition wall 290 may perform the role of dividing individual sub-pixels from one another, and be formed as an integral body with the conductive adhesive layer 230. For example, a base member of the anisotropic conductive film may form the partition wall when the semiconductor light emitting element 250 is inserted into the anisotropic conductive film.

Furthermore, when the base member of the anisotropic conductive film is black, the partition wall 290 may have reflective characteristics and simultaneously increase contrast even without an additional black insulator.

For another example, a reflective partition wall may be separately provided as the partition wall 290. In this case, the partition wall 290 may include a black or white insulator according to the purpose of the display device.

If the second electrode 240 is precisely located on the conductive adhesive layer 230 between the semiconductor light emitting elements 250, the partition wall 290 may be located between the semiconductor light emitting element 250 and second electrode 240. Accordingly, individual sub-pixels may be configured even with a small size using the semiconductor light emitting element 250, and a distance between the semiconductor light emitting elements 250 may be relatively sufficiently large to dispose the second electrode 240 between the semiconductor light emitting elements 250, thereby having the effect of implementing a flexible display device having a HD image quality.

Furthermore, according to the drawing, a black matrix 291 may be disposed between each phosphor layer to enhance contrast. In other words, the black matrix 291 can enhance the contrast of luminance.

In this manner, the semiconductor light emitting element 250 is disposed on the conductive adhesive layer 230, thereby configuring a separate sub-pixel in the display device. Since the semiconductor light emitting element 250 has excellent brightness, it can constitute an individual unit pixel even though it has a small size. As a result, it may be possible to implement a full color display in which the sub-pixels of red (R), green (G) and blue (B) implement one pixel by means of the semiconductor light emitting element.

In the display unit using the semiconductor light emitting element in accordance with the present disclosure, the semiconductor light emitting element that is grown on the wafer and formed through mesa and isolation is used as individual pixels. Since the semiconductor light emitting element that is grown on wafers is transcribed to wiring boards, it is technically very difficult to implement RGB color by disposing three types of the red semiconductor light emitting elements, green semiconductor light emitting elements and blue semiconductor light emitting elements for the displays with the fine pitch of 400 ppi or higher. This is because the pitch values between each sub-cell need to be extremely small, requiring the technology to select and transcribe a micro-LED of less than 10 micrometers. Furthermore, there is a spacing limit between pixels due to problems such as the color crosstalk between sub-cells.

In order to overcome the problems as above, the configuration in which micro-red/green/blue LEDs are laminated is applied to the present disclosure. Hereinafter, description will be given in more detail of such embodiments with reference to the accompanying drawings.

Figure 10:
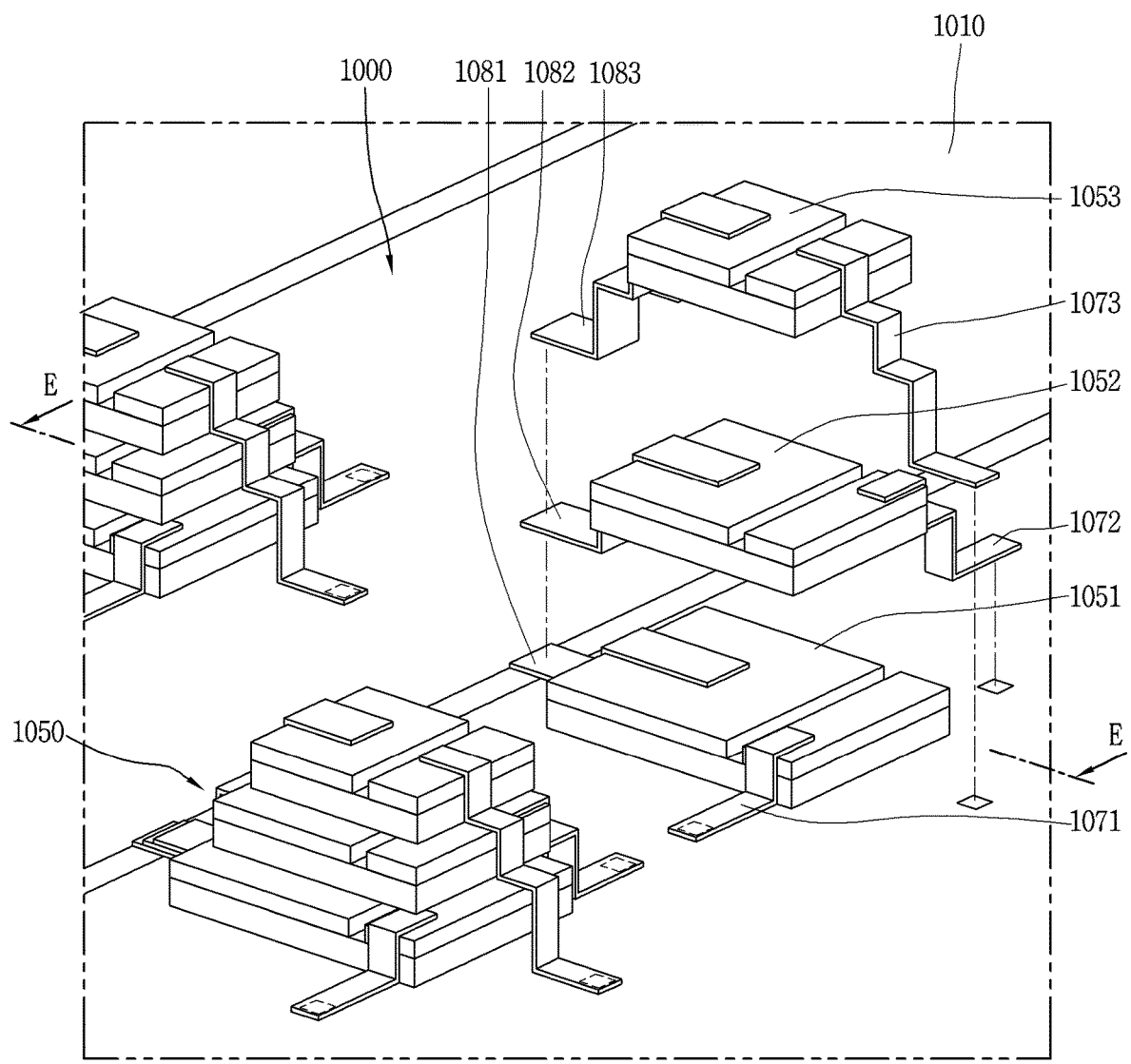
FIG. 10 is a partial perspective view illustrating another embodiment of the display device according to the present invention.
Figure 11:
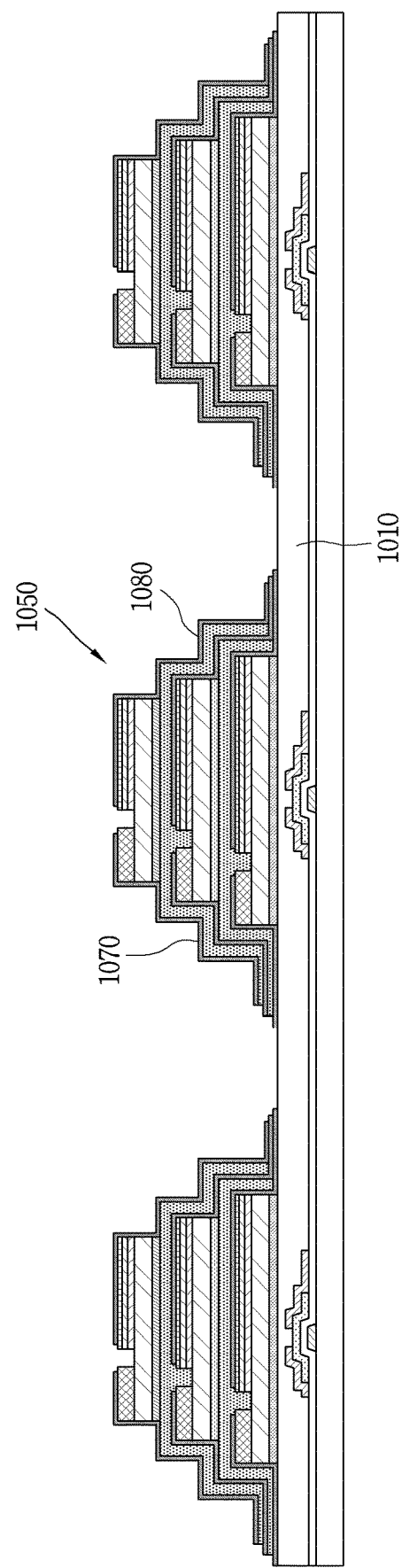
FIG. 11 is a sectional view taken along the line E-E of FIG. 10.
Figure 12:
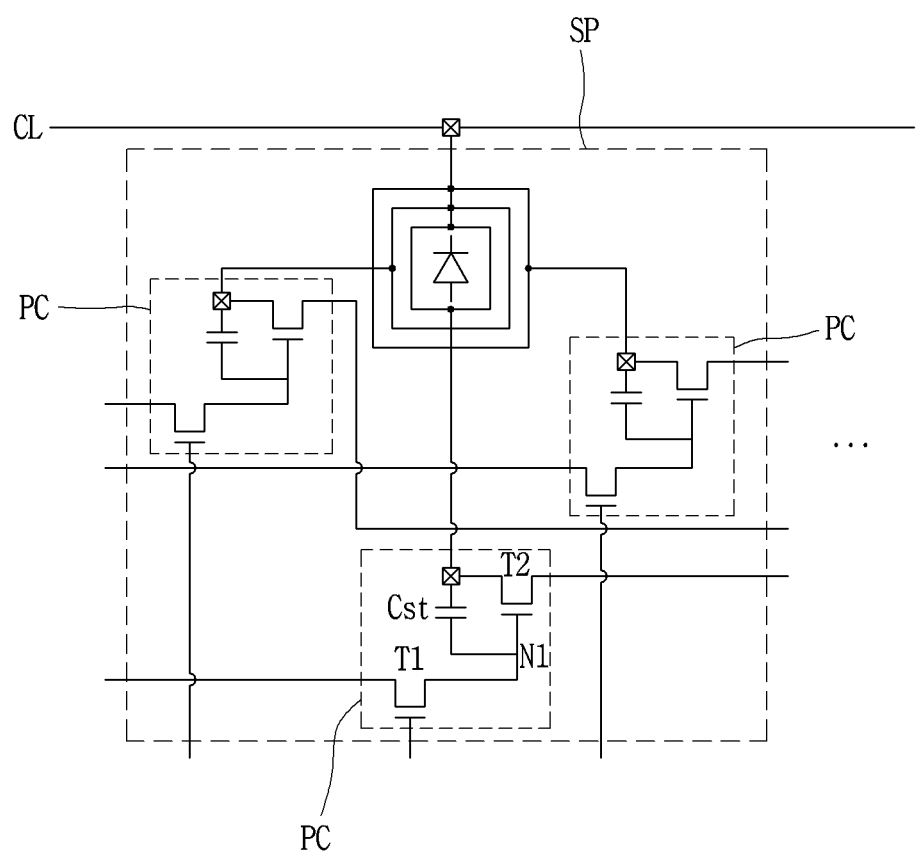
FIG. 12 is a circuit diagram illustrating the structure of the pixel of FIG. 10.
Figure 13:
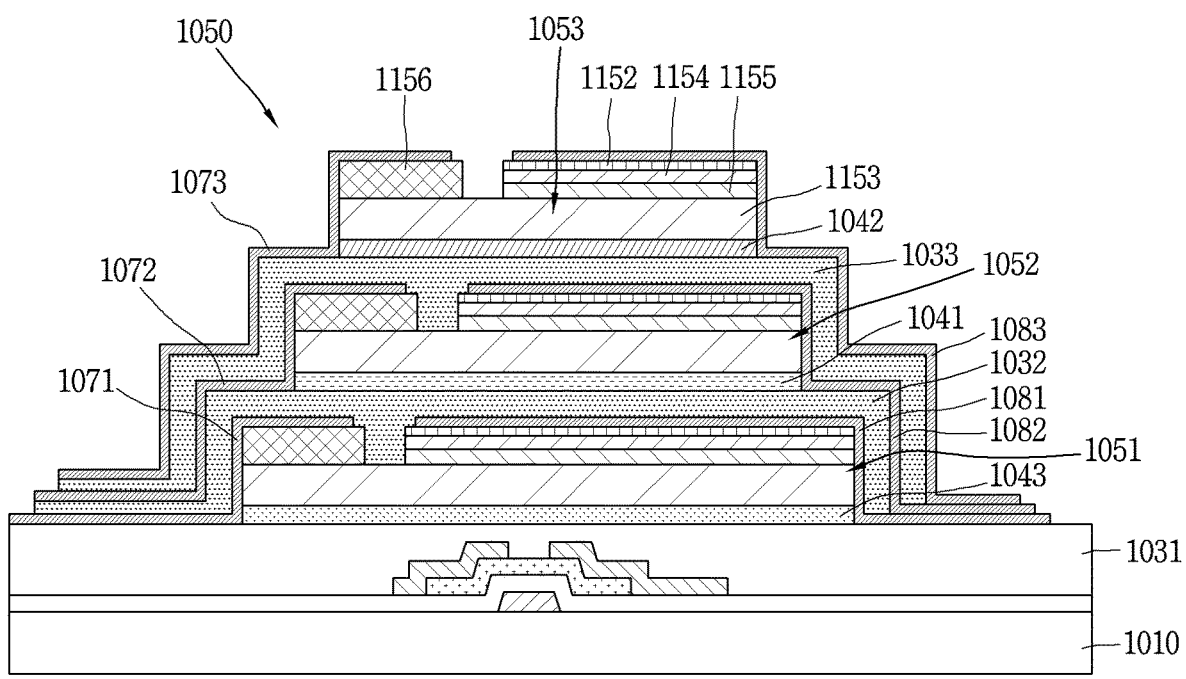
FIG. 13 is an enlarged view illustrating the light emitting element module of FIG. 10.
Figure 14:
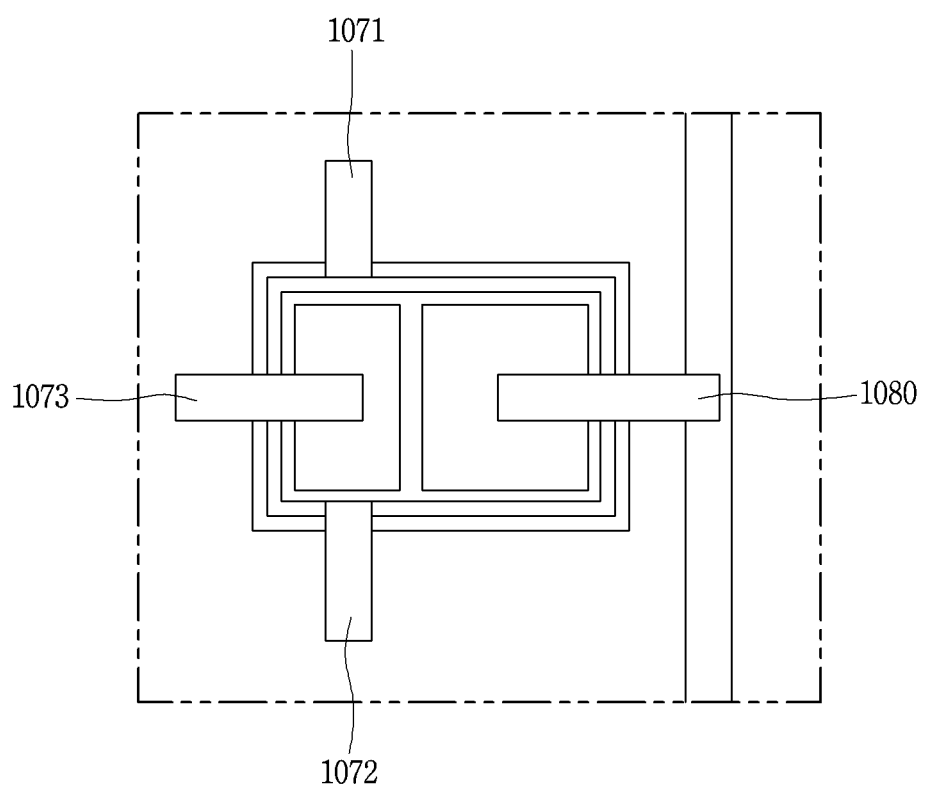
FIG. 14 is a plane view illustrating the light emitting element module of FIG. 10.
Figure 15:
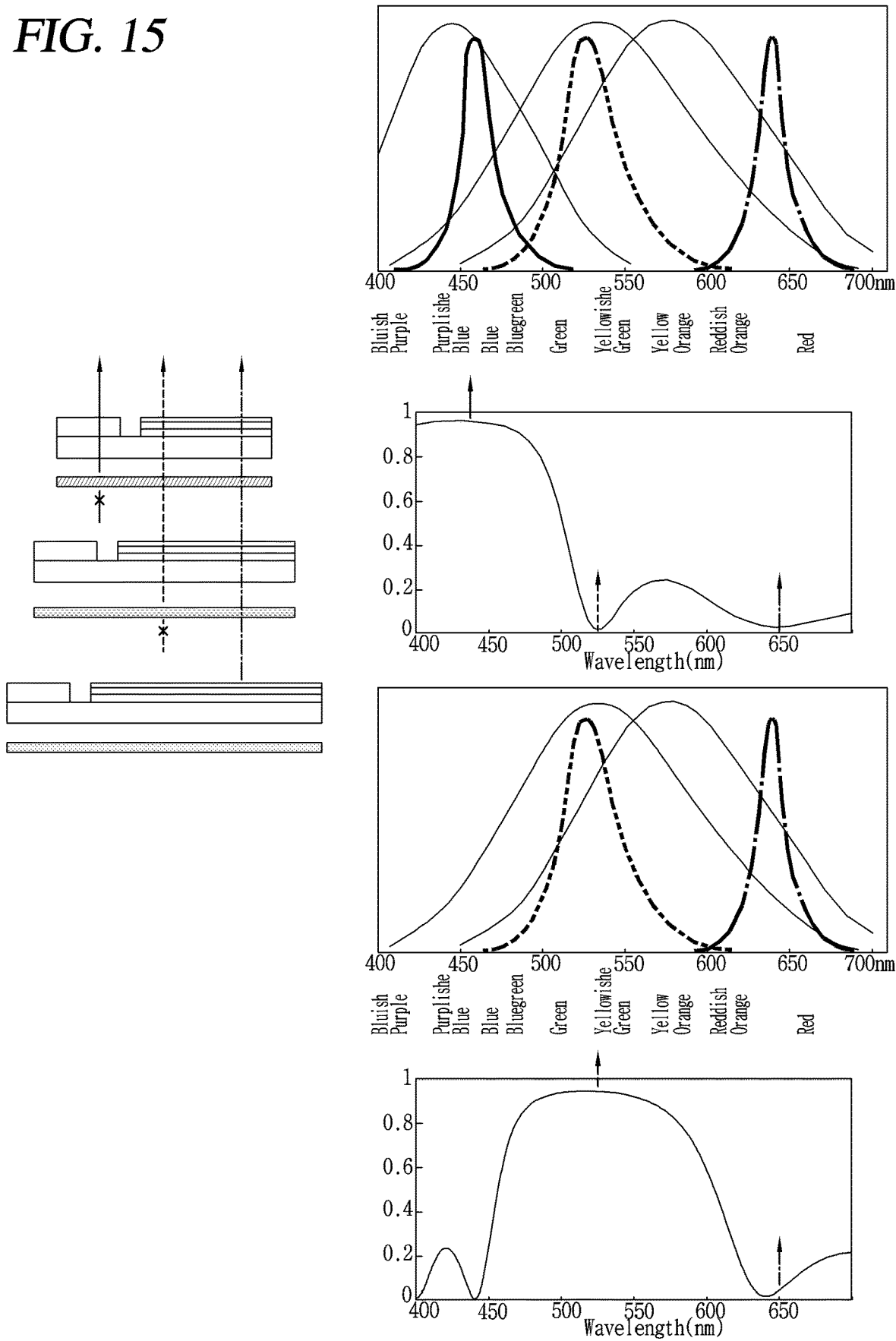
FIG. 15 is a conceptual view illustrating outputting red, green and blue lights from the light emitting element module of FIG. 10.

FIG. 10 is a partial perspective view illustrating another embodiment of the display device according to the present invention, FIG. 11 is a sectional view taken along the line E-E of FIG. 10, FIG. 12 is a circuit diagram illustrating the structure of the pixel of FIG. 10, FIG. 13 is an enlarged view illustrating the light emitting element module of FIG. 10, FIG. 14 is a plane view illustrating the light emitting element module of FIG. 10, and FIG. 15 is a conceptual view illustrating outputting red, green and blue lights from the light emitting element module of FIG. 10.

Referring to FIGS. 10 through 15, there is exemplary shown a display device 1000 using a semiconductor light emitting element, that is, using a semiconductor light emitting element of the active matrix type. However, the embodiment exemplary shown and described hereinafter may also be applied to the passive matrix type semiconductor light emitting element.

The display device 1000 includes a substrate 1010 and a plurality of semiconductor light emitting elements.

The substrate 1010 is a thin film transistor array substrate that may be formed of a glass or plastic material. In addition, the substrate 1010 may include polyimide to implement a flexible display device. Additionally any other material having insulating properties may be used.

The plurality of semiconductor light emitting elements may form a light emitting element module 1050 by laminating the semiconductor light emitting elements, as shown in FIG. 4.

For example, the light emitting element module 1050 may include a red semiconductor light emitting element 1051, a green semiconductor light emitting element 1052, and a blue semiconductor light emitting element 1053.

The green semiconductor light emitting element 1052 and blue semiconductor light emitting element 1053 may have the aforementioned configuration referring to FIG. 4, respectively, and may be implemented as a high capacity light emitting element that emits green or blue light, by adding indium (In) and/or aluminum (Al) to main component of gallium nitride (GaN). For example, the multiple semiconductor light emitting elements 1050 may be gallium nitride thin film formed into various layers such as n-Gan, p-Gan, AlGaN, InGan, etc. Specifically, the p-type semiconductor layer may be P-type GaN, and the N-type semiconductor layer may be N-type GaN. However, for the red semiconductor light emitting element 1051, the p-type semiconductor layer may be P-type GaAs and the n-type semiconductor layer may be N-type GaAs.

In this example, the p-type semiconductor layer may be a P-type GaN with Mg doped on the p-electrode side and the n-type semiconductor layer may be an N-type GaN with Si doped on the n-electrode side. In this instance, the aforementioned semiconductor light emitting elements may be semiconductor light emitting elements without active layers.

In addition, the semiconductor light emitting element may be a micro-light emitting diode chip. Here, the micro-light emitting diode chip may have a sectional area smaller than the size of the light emitting region in the sub-pixel, and, for example, may have a scale of 1 to 100 micrometers.

The semiconductor light emitting element may be referred to as a micro-light emitting element (LED), with an area of 25 to 250000 micrometers, and the thickness of the chip may be about 2 to 10 square micrometers.

Referring to FIG. 13, the red semiconductor light emitting element 1051, green semiconductor light emitting element 1052 and blue semiconductor light emitting element 1053 include a first conductive electrode 1156, a first conductive semiconductor layer 1155 on which the first conductive electrode 1156 is formed, an active layer 1154 formed on the first conductive semiconductor layer 1155, a second conductive semiconductor layer 1153 formed on the active layer 1154, and a second conductive layer electrode 1152 disposed to be spaced apart from the first conductive electrode 1156 in a parallel direction on the second conductive semiconductor layer 1153, respectively. In this instance, the second conductive electrode 1152 is disposed on one surface of the second conductive semiconductor layer 1153, and on the other surface of the second conductive semiconductor layer 1153, an un-doped semiconductor layer 1153a may be formed.

In addition, the first conductive electrode 1156 and the first conductive semiconductor layer 1155 may be p-type electrode and p-type semiconductor layer, respectively, while the second conductive electrode 1152 and the second conductive semiconductor layer 1153 may be n-type electrode and n-type semiconductor layer, respectively. However, the present disclosure is not necessarily limited to this example, and it is possible to give examples where the first conductive type becomes n-type and the second conductive type becomes p-type.

As shown, part of the first conductive semiconductor layer 1155 and active layer 1154 is mesa etched to cover only part of the second conductive semiconductor layer 1153. Therefore, some of the top faces of the above second conductor semiconductor layer 1153 are exposed to the outside, while others are covered by the first conductive semiconductor layer 1155 and active layer 1154. In this instance, an un-doped semiconductor layer (not shown) may be formed on the lower surface of the second conductive semiconductor layer 1153.

Referring to FIG. 13, the top surface of the first conductive semiconductor layer 1155 and the second conductive semiconductor layer 1153 may be a surface far from the substrate, and the bottom surface of the first conductive semiconductor layer 1155 and the second conductive semiconductor layer 1153 may be a surface close to the substrate.

As shown, the green semiconductor light emitting element 1052 is disposed on the top of the red semiconductor light emitting element 1051, and the blue semiconductor light emitting element 1053 is disposed on the top of the green semiconductor light emitting element 1052.

More specifically, the red semiconductor light emitting element 1051 may be attached to the substrate through an adhesive layer 1031. In this instance, the conductive adhesive layer described in the previous example may be excluded. In addition, the green semiconductor light emitting element 1052 is attached to the top surface of the red semiconductor light emitting element 1051. For this purpose, a first light transmittance adhesive layer 1032 is disposed to cover the red semiconductor light emitting element 1051, and the green semiconductor light emitting element 1052 may be attached to the first light transmittance adhesive layer1032.

In addition, the blue semiconductor light emitting element 1053 is attached to the top surface of the green semiconductor light emitting element 1052. For this purpose, a second light transmittance adhesive layer 1033 is disposed to cover the green semiconductor light emitting element 1052, and the blue semiconductor light emitting element 1053 may be attached to the second light transmittance adhesive layer 1033.

As such, the red semiconductor light emitting element 1051, the green semiconductor light emitting element 1052 and the blue semiconductor light emitting element 1053 are laminated such that a light source of short wavelength is located below, and attached to each other using the light transmittance adhesive layer, implementing a light emitting element module 1050 that selectively outputs red, green and blue light in a narrow area.

As such, a key issue in the color implementation with RGB lamination is the color-to-color mix. A light source with relatively high energy, or short wavelengths, may excite a light source with long wavelengths. For example, when it is desired to turn on green only, green semiconductor light emitting element will optically excite red semiconductor light emitting element at a lower part. To prevent such phenomenon, the distributed Bragg reflector may be laminated together with the semiconductor light emitting element Referring to FIGS. 13 and FIG. 15, between the red semiconductor light emitting element 1051 and the green semiconductor light emitting element 1052, a first distributed Bragg reflector (DBR) that penetrate red and reflects green may be disposed. In addition, between the green semiconductor light emitting element 1052 and the blue semiconductor light emitting element 1053, a second distributed Bragg reflector 1042 that penetrates green and red and reflects blue may be disposed, Since the first distributed Bragg reflector 1041 and the second distributed Bragg reflector 1042 penetrate red, when the red semiconductor light emitting element 1051 disposed at the lowest part is turned on, red light may penetrate the first distributed Bragg reflector 1052, the green semiconductor light emitting element 1052, the second distributed Bragg reflector 1042, and the blue light emitting element 1053 in order, and then emitted to the outside. In this instance, on a bottom surface of the red semiconductor light emitting element 1051, a third distributed Bragg reflector that reflects red 1043 or metal mirror may be disposed.

In addition, since the first distributed Bragg reflector 1041 reflects green, and the second distributed Bragg reflector 1042 penetrates green, when the green semiconductor light emitting element 1052 disposed in the middle is turned on, green light is reflected from the first distributed Bragg reflector 1041, and penetrates the second distributed Bragg reflector 1042 and the blue reflector 1053, then emitted to the outside. Therefore, the green light does not excite the red semiconductor light emitting element 1051.

Finally, since the second distributed Bragg reflector 1042 reflects blue, the blue light from the blue semiconductor light emitting element 1053 does not excite the green semiconductor light emitting element 1052 of the lower part, while being emitted to the outside.

Meanwhile, referring to FIGS. 10 through 14, the light emitting element module 1050 may be one of light emitting element modules that are consecutively aligned on the substrate along the rows and lines.

Each of the light emitting element modules forms a single pixel (SP), so multiple pixels (SPs) may be aligned on the substrate. The pixels (SP) have a layered structure of blue, green and red semiconductor light emitting elements, as described above, which selectively output blue, green and red light. In this instance, each of the multiple pixels (SP) includes a pixel circuit (PC) and may be electrically connected to a common power line (CL).

The pixel circuit (PC) may be equipped with three per one pixel (SP). More specifically, three pixel circuits (PC), each connected to a red semiconductor light emitting element, a green semiconductor light emitting element, and a blue semiconductor light emitting element, may be disposed adjacent to the pixel (SP).

The pixel circuit (PC) is connected to the gate line, the data line and the drive power line. In addition, the pixel circuit (PC) is configured to control electric current flowing through the light emitting element by data signal from the data line, in response to a scan pulse from the gate line, based on the pixel drive power supply supplied to the drive power line. The pixel circuit (PC) according to one example may include switching transistors (T1), drive transistors (T2), and capacitors (Cst).

The switching transistor (T1) includes a gate electrode connected to a gate line, a first electrode connected to a data line, and a second electrode connected to the gate electrode (N1) of a drive transistor (T2). Here, the first and second electrodes of the switching transistor (T1) may be source electrodes or drain electrodes depending on the direction of the current. The switching transistor (T1) is switched according to the scan pulse supplied to the gate line and supplies the data signal supplied to the data line to the drive transistor (T2).

The drive transistor (T2) controls the amount of current flowing from the drive power line to the light emitting element by turning-on by the voltage supplied from the switching transistor (T1) and/or the voltage of the capacitor (Cst). The capacitor (Cst) is arranged in the overlapped area between the drive transistor (T2) and the source electrode of the gate electrode (N1), and configured to store the voltage corresponding to the data signal supplied to the gate electrode of the drive transistor (T2) and to turn-on the drive transistor (T2) with the stored voltage.

As shown in the drawings, the light emitting modules may be configured to be electrically connected to each of the pixel circuits (PCs) corresponding to each blue, green and red color. For example, referring to FIGS. 10 through 14, the light emitting element module of the present disclosure may include an individual electrode portion 1070 that supplies individual signals to each of the red semiconductor light emitting element, the green semiconductor light emitting element and the blue semiconductor light emitting element, and a common electrode 1080 part that supplies common signals to the red semiconductor light emitting element, the green semiconductor light emitting element, and the blue semiconductor light emitting element.

Since the red semiconductor light emitting element 1051, green semiconductor light emitting element 1052, and blue semiconductor light emitting element 1053 are laminated, for the purpose of wiring the individual electrode portion 1070, the light emitting module may be formed so that the area becomes smaller in the order of the red semiconductor light emitting element 1051, the green semiconductor light emitting element1052, and the blue semiconductor light emitting element 1053.

More specifically, the individual electrode portion 1070 may include a red electrode portion 1071 electrically connected to the red semiconductor light emitting element 1051, a green electrode portion 1072 electrically connected to the green semiconductor light emitting element 1052, and a blue electrode portion 1073 electrically connected to the blue semiconductor light emitting element 1053. The red electrode portion 1071, the green electrode portion 1072 and the blue electrode portion 1073 may be formed as light transmittance electrodes, respectively, as examples of this can be ITO electrodes.

The red electrode portion 1071, the green electrode portion 1072 and the blue electrode portion 1073 may be extended along the sides of the semiconductor light emitting element, respectively, so as to be connected to the substrate 1010.

As shown in the drawings, the red electrode portion 1071 is disposed on the second conductive semiconductor layer of the red semiconductor light emitting element 1051, and is electrically connected with the second conductive electrode. However, the present disclosure is not necessarily limited to this, and it is also possible for the red electrode portion 1071 to be connected directly to the second conductive semiconductor layer without the second conductive electrode. In addition, the red electrode portion 1071 may be extended along the side of the red semiconductor light emitting element 1051 and connected to the pixel circuit (PC). In addition, the light transmittance adhesive layer 1032 is formed to cover the red electrode portion 1071.

The green electrode portion 1072 is located in the second conductive semiconductor layer of the green semiconductor light emitting element 1052, and is electrically connected to the second conductive electrode. However, the present disclosure is not necessarily limited to this, and it is also possible for the green electrode portion 1072 to be connected directly to the second conductive semiconductor layer without the second conductive electrode. In addition, the green electrode portion 1072 is extended along the side of the green semiconductor light emitting element 1052 and may be extended along the side of the first light transmittance layer 1032 at the face of the green semiconductor light emitting element 1052 and connected to the pixel circuit (PC). The second light transmittance adhesive layer 1033 to which the blue semiconductor light emitting element 1053 is attached is extended towards the red semiconductor light emitting element 1051 to cover the first light emitting adhesive layer 1032, and the green electrode portion 1072 is covered by the second light transmittance layer 1033.

The blue electrode portion 1073 is located in the second conductive semiconductor layer 1153 of the blue semiconductor light emitting element 1053, and is electrically connected to the second conductive electrode 1156. However, the present disclosure is not necessarily limited to this, and it is also possible for the blue electrode portion 1073 to be connected directly to the second conductive semiconductor layer without the second conductive electrode. In addition, the blue electrode portion 1073 is extended along the side of the blue semiconductor light emitting element 1053 to the front face of the second light emitting adhesive layer 1033. The blue electrode portion 1073 is extended along the face of the second light transmittance adhesive layer 1033, and is electrically connected to the pixel circuit (PC).

The common electrode portion 1080 may include the first electrode portion 1081 electrically connected to the red semiconductor light emitting element 1051, the second electrode portion 1082 electrically connected to the green semiconductor light emitting element 1052, and the third electrode portion 1083 electrically connected to the blue semiconductor light emitting element 1053. The first electrode portion 1081, the second electrode portion 1082 and third electrode portion 1083 are disposed on the first conductive semiconductor layer of the semiconductor light emitting element, respectively, and may be extended along the side of the semiconductor light emitting element so as to be connected to the substrate.

As shown in the drawings, the first electrode portion 1081 is disposed in the first conductive semiconductor layer of the red semiconductor light emitting element 1051 and may be extended along the side of the red semiconductor light emitting element 1051 to be connected to a common power line (CL). In addition, the first light transmittance adhesive layer 1032 is formed to cover the first electrode portion 1081.

The second electrode portion 1082 is disposed on the second conductive semiconductor layer of the green semiconductor light emitting element 1052, extended along the side of the green semiconductor light emitting element 1052, and may be extended along one surface of the first light transmittance adhesive layer 1032 at a bottom surface of the green semiconductor light emitting element 1052 so as to be connected to the common power line (CL). The second electrode portion 1082 is covered by the second light transmittance layer 1033.

The third electrode portion 1083 is disposed on the second conductive semiconductor layer of the blue semiconductor light emitting element 1053, extended along the side of the blue semiconductor light emitting element, and then connected to the front of the second light transmittance adhesive layer 1033. The third electrode portion 1083 is extended along the side of the second light transmittance adhesive layer 1033, and is electrically connected to the common power line (CL).

In this instance, the first electrode portion 1081, the second electrode portion 1082 and the third electrode portion 1083 are connected to each other on the side of the adhesive layer 1031 that attaches the red semiconductor light emitting element to the substrate to form a wiring line, and the wiring line may be extended to the common power line (CL).

As shown in FIGS. 10 through 14, the red electrode portion 1071, the green electrode portion 1072, and the blue electrode portion 1073 may be disposed on different sides of the light emitting module 1050. In addition, the common electrode portion 1080 may be disposed on the side where the red electrode portion 1071, green electrode portion 1072 and blue electrode portion 1073 are not disposed on the light emitting module 1050. The light emitting module 1050 may be formed in the rectangular form, and on the three sides of the rectangle, the red electrode portion 1071, the green electrode portion 1072, and the blue electrode portion 1073 may be disposed, respectively, and the common electrode portion 1080 may be located on the remaining side. Under this configuration, wiring to the light emitting element module of the present disclosure may be possible.

As described hereinbefore, there is provided a laminated RGB light emitting element module which can eliminate the problems such as the limitation of the size of sub-cell and the limitation of the pitch between cells, and thus enabling a display device with a fine pitch to be implemented.

Meanwhile, the display device in accordance with the present disclosure may be varied in various forms. For instance, it is possible to apply the RGB pixel formed by laminating on the TSV silicon wafer to other type of drive board.

Hereinafter, description will be given of the configuration of the display device with reference to the drawings.

Figure 16:
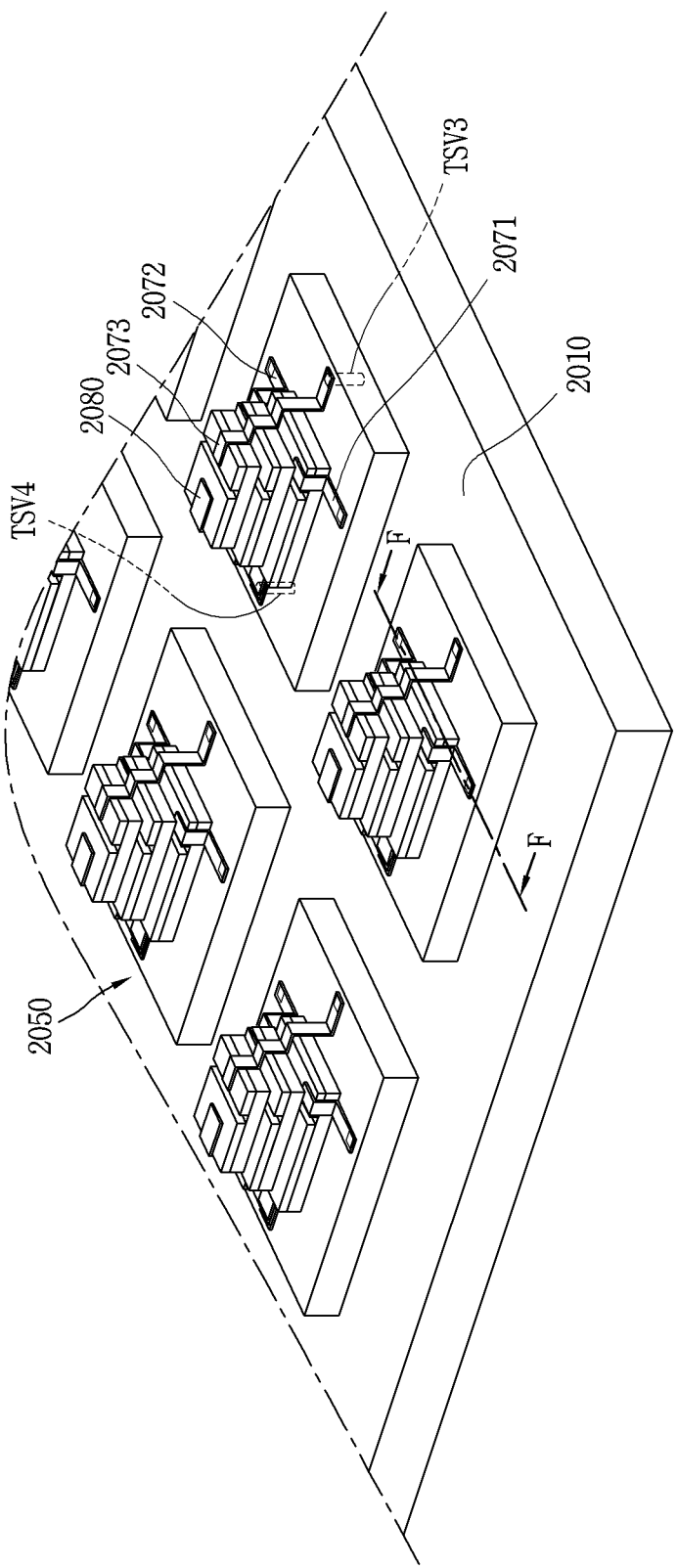
FIG. 16 is a conceptual view illustrating another embodiment of a display device according to the present invention.
Figure 17:
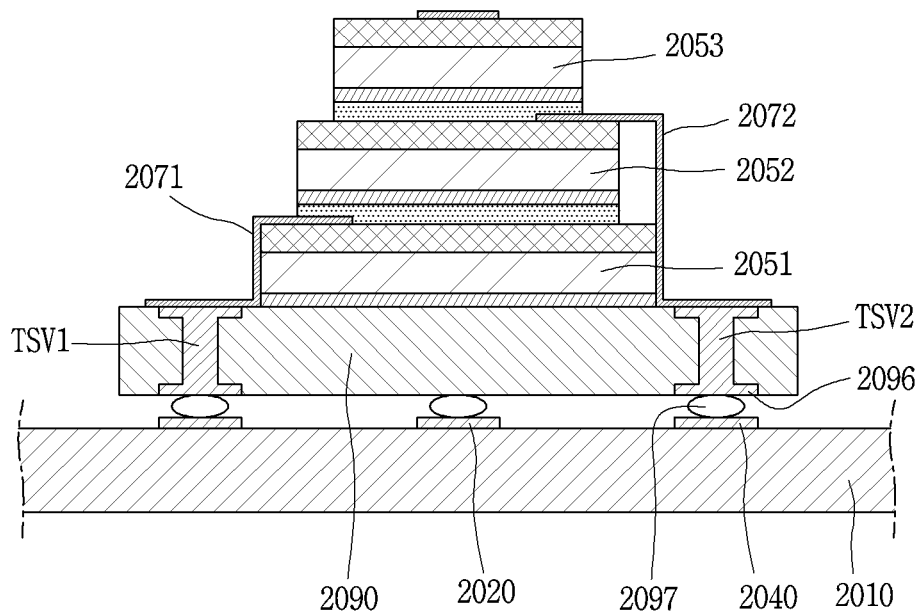
FIG. 17 is a sectional view taken along the line F-F of FIG. 16.

FIG. 16 is a conceptual view illustrating another embodiment of a display device according to the present invention, and FIG. 17 is a sectional view taken along the line F-F of FIG. 16.

As shown in FIGS. 16 and 17, the display device 2000 using a semiconductor light emitting element includes a substrate 2010 and a plurality of light emitting modules 2050.

The substrate 2010 may be a wiring board in which a first electrode 2020 and a second electrode 2040 are disposed. Therefore, the first electrode 2020 and the second electrode 2040 may be located on the substrate 2010. At this time, the first electrode 2020 and the second electrode 2040 may be a wiring electrode.

The substrate 2010 may be formed of a material with insulating properties, but non-flexible. In addition, the substrate 2010 may be formed of any transparent or opaque material.

Referring to the drawings above, the light emitting module 2050 is coupled on one surface of the substrate 2010. For example, electrodes of the light emitting module 2050 may be combined into the wiring electrode, e.g. by soldering. In this instance, the conductive adhesive layer described in the previous example may be excluded.

As shown in the drawings, one light emitting module 2050 includes multiple semiconductor light emitting elements 2051, 2052 and 2053 and support substrates 2090.

Multiple semiconductor light emitting elements 2051, 2052 and 2053 may be red semiconductor light emitting elements, green semiconductor light emitting elements, and blue semiconductor light emitting elements, respectively, and their configurations may be the same as those of the semiconductor light emitting elements referred to with reference to FIGS. 10 through 15. Therefore, the explanation on this is replaced by the foregoing.

The light emitting module implemented by the above configuration is supported by the support substrate 2090.

The support substrate 2090 is formed of silicon material, and the support substrate 2090 has a through-silicon-via electrode (TSV: Through Silicon Via).

The through-silicon-via electrode (TSV) may be formed by filling a via-hole with conductive material. Thus, with the use of the support substrate 2090 equipped with the through-silicon-via electrode (TSV), one-to-one transcription at the wafer level can be very easy.

More specifically, since the support substrate 2090 is a silicon substrate that can be etched, the etching may result in the formation of the through-silicon-via electrode (TSV) by the etching. The through-silicon-via electrode (TSV) penetrates the support substrate 2090 at the location where it is overlapped with the semiconductor light emitting element.

The through-silicon-via electrode (TSV) may be provided in multiple numbers to correspond to each semiconductor light emitting element. The first through-silicon-via electrode (TSV1), the second through-silicon-via electrode (TSV2) and the third through-silicon-via electrode (TSV3) may be located to correspond to the red semiconductor light emitting element 2051, the green semiconductor light emitting element 2052, and the blue semiconductor light emitting elements 2053. In this instance, the first through-silicon-via electrode (TSV1), the second through-silicon-via electrode (TSV2) and the third through-silicon-via electrode (TSV3) may be electrically connected to the red electrode portion 2071, the green electrode portion and the blue electrode portion, respectively.

On the other hand, the support substrate may include a fourth through-silicon-via electrode (TSV4) which is electrically connected to the common electrode portion 2080 of the light emitting module. The common electrode portion 2080 has the same structure as described in FIGS. 10 through 15 with the above red electrode portion 2071, green electrode portion 2072, and blue electrode portion 2073, so replace the description with the above description.

As the common electrode portion 2080 is extended to the fourth through-silicon-via electrode (TSV4), the first conductive electrode of the red semiconductor light emitting element 2051, green semiconductor light emitting element 2052, and blue semiconductor light emitting element 2053 is electrically connected to the other side of the support substrate by means of the fourth through-silicon-via electrode (TSV4) as a common through-silicon-via electrode. A lower electrode 2096 may be located at the bottom of the first through-silicon-via electrode (TSV1), second through-silicon-via electrode (TSV2), third through-silicon-via electrode (TSV3), and fourth through-silicon-via electrode (TSV4), respectively.

According to the structure described above, the through-silicon-via electrode are equipped with a single through-silicon-via electrode (TSV4) connected respectively to the common electrode and multiple through-silicon-via electrodes (TSV1, TSV2, TSV3) connected to the second conductive electrodes of the multiple semiconductor light emitting elements.

According to the configuration described above, the light emitting module forms a single pixel, with the support substrate 2090 as a unit board. In other words, the light emitting module is obtained by chamfering on the wafer through dicing or other means and may be moved to the wiring substrate 2010 by pick and play etc.

For example, between the wiring substrate 2010 and the light emitting module 2050, a low-melting part 2097 consisting of a low-melting material may be disposed rather than the wiring electrode 2020 and 2040 of the wiring substrate 2010. As a specific example, a low melting part 2097 is disposed between the wiring electrodes 2020 and 2040 of the wiring substrate 2010 and the lower electrode 2096 of the supporting substrate 2090 to implement electrical engagement.

For example, the low melting part 2097 may be disposed to the wiring electrode with solder material. The solder material may be, for example, at least one of Sb, Pd, Ag, Au and Bi. In this instance, solder may be deposited to the wiring electrode and soldering may be carried out using thermal energy.

As shown in the drawings, the wiring substrate 2010 may be larger than the supporting substrate 2090. Multiple support substrates are disposed at preset intervals on the wiring substrate 2010, resulting in implementing the display unit. The semiconductor light emitting element packages may be formed in blank spaces as illustrated, but this invention is not necessarily limited to this. For example, the empty space may be filled with insulating materials, etc., or the unit substrate may be disposed in contact with each other so that there is no such space. Under the configuration described above, an RGB pixel is implemented on wafers such that a display device that can be coupled to other drive boards may be implemented.

The aforementioned display device using the semiconductor light emitting element are not limited to the configuration and the method of the embodiments described above, but the embodiments may be configured such that all or some of the embodiments are selectively combined so that various modifications can be made.

What is claimed is:
1. A display device comprising:
a light emitting element module on a substrate,
wherein the light emitting element module comprises:
   a plurality of semiconductor light emitting elements disposed on the substrate;
   a plurality of individual electrode portions electrically connected to each of the plurality of semiconductor light emitting elements; and
   a common electrode portion electrically connected to each of the plurality of semiconductor light emitting elements, and
wherein the plurality of light emitting elements comprise:
   a first semiconductor light emitting element;
   a second semiconductor light emitting element disposed on the first semiconductor light emitting element; and
   a third semiconductor light emitting element disposed on the second semiconductor light emitting element,
wherein each of the plurality of individual electrode portions is disposed on different sides of the light emitting element module, and
wherein each of the plurality of individual electrode portions supplies an individual signal to each of the first semiconductor light emitting element, the second semiconductor light emitting element, and the third semiconductor light emitting element, respectively.

2. The display device of claim 1, wherein the common electrode portion supplies a common signal to all of the first semiconductor light emitting element, the second semiconductor light emitting element, and the third semiconductor light emitting element.

3. The display device of claim 2, wherein the plurality of individual electrode portions comprise a first electrode portion, a second electrode portion and a third electrode portion each electrically connected to the first semiconductor light emitting element, the second semiconductor light emitting element and the third semiconductor light emitting element, respectively.

4. The display device of claim 3, wherein the first electrode portion, the second electrode portion and the third electrode portion are disposed on the different sides of the light emitting element module.

5. The display device of claim 1, further comprising a first light transmittance adhesive layer interposed between the first semiconductor light emitting element and the second semiconductor light emitting element.

6. The display device of claim 5, wherein the first electrode portion is covered by the first light transmittance adhesive layer.

7. The display device of claim 5, further comprising a second light transmittance adhesive layer interposed between the second semiconductor light emitting element and the third semiconductor light emitting element.

8. The display device of claim 7, wherein the second light transmittance adhesive layer is extended toward the first semiconductor light emitting element configured to cover the first light transmittance adhesive layer.

9. The display device of claim 7, wherein the first light transmittance adhesive layer and the second light transmittance adhesive layer are in contact with the plurality of individual electrode portions and the common electrode portion in vertical and horizontal directions.

10. A display device comprising:
a light emitting element module on a substrate,
wherein the light emitting element module comprises:
a plurality of semiconductor light emitting elements disposed on the substrate;
a plurality of individual electrode portions electrically connected to each of the plurality of semiconductor light emitting elements;
a common electrode portion electrically connected to each of the plurality of semiconductor light emitting elements; and
a plurality of distributed Bragg reflectors (DBRs) disposed between the plurality of semiconductor light emitting elements,
wherein the plurality of light emitting elements comprise:
a first semiconductor light emitting element;
a second semiconductor light emitting element disposed on the first semiconductor light emitting element; and
a third semiconductor light emitting element disposed on the second semiconductor light emitting element, and
wherein each of the plurality of individual electrode portions supplies an individual signal to each of the first semiconductor light emitting element, the second semiconductor light emitting element, and the third semiconductor light emitting element, respectively.

11. The display device of claim 10, wherein the plurality of distributed Bragg reflectors (DBRs) comprise a first distributed Bragg reflector (DBR) disposed between the first semiconductor light emitting element and the second semiconductor light emitting element and a second distributed Bragg reflector (DBR) disposed between the second semiconductor light emitting element and the third semiconductor light emitting element of the plurality of semiconductor light emitting elements.

12. The display device of claim 11, wherein the first DBR transmits a first light of the first semiconductor light emitting element and reflects a second light of the second semiconductor light emitting element, and
wherein the second DBR transmits the second and first lights, and reflects a third light of the third semiconductor light emitting element.

13. The display device of claim 12, wherein the plurality of distributed Bragg reflectors (DBRs) further comprise a third distributed Bragg reflector (DBR) that reflects the first light, or a metal mirror, and
wherein the third DBR or the metal mirror is disposed below the first semiconductor light emitting element.

14. The display device of claim 10, wherein each of the plurality of individual electrode portions is disposed on different sides of the light emitting element module.

15. The display device of claim 10, wherein the common electrode portion supplies a common signal to all of the first semiconductor light emitting element, the second semiconductor light emitting element, and the third semiconductor light emitting element.

16. The display device of claim 10, wherein the plurality of individual electrode portions comprise a first electrode portion, a second electrode portion and a third electrode portion each electrically connected to the first semiconductor light emitting element, the second semiconductor light emitting element and the third semiconductor light emitting element, respectively.

17. The display device of claim 16, wherein the first electrode portion, the second electrode portion and the third electrode portion are disposed on the different sides of the light emitting element module.

18. The display device of claim 10, further comprising a first light transmittance adhesive layer interposed between the first semiconductor light emitting element and the second semiconductor light emitting element of the plurality of light emitting elements.

19. The display device of claim 18, further comprising a second light transmittance adhesive layer interposed between the second semiconductor light emitting element and the third semiconductor light emitting element of the plurality of light emitting elements.

* * * * *